(12) United States Patent
Park et al.

(10) Patent No.: US 12,479,865 B2
(45) Date of Patent: Nov. 25, 2025

(54) ORGANIC COMPOUND, ORGANIC PHOTOELECTRIC DEVICE, IMAGE SENSOR, AND ELECTRONIC DEVICE

(71) Applicant: SAMSUNG ELECTRONICS CO., LTD., Suwon-si (KR)

(72) Inventors: Hye Yun Park, Hwaseong-si (KR); Yoshiaki Obana, Seongnam-si (KR); Kouji Iino, Tokyo (JP); Rieko Hamada, Tokyo (JP); Hiroshi Morita, Tokyo (JP); Jun Won Han, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1109 days.

(21) Appl. No.: 17/381,538

(22) Filed: Jul. 21, 2021

(65) Prior Publication Data

US 2022/0041628 A1    Feb. 10, 2022

(30) Foreign Application Priority Data

Aug. 5, 2020 (KR) .................. 10-2020-0097863

(51) Int. Cl.
*C07F 5/02* (2006.01)
*H10K 30/30* (2023.01)
(Continued)

(52) U.S. Cl.
CPC .............. *C07F 5/022* (2013.01); *C07F 5/027* (2013.01); *H10K 85/322* (2023.02);
(Continued)

(58) Field of Classification Search
None
See application file for complete search history.

(56) References Cited

U.S. PATENT DOCUMENTS

2019/0103521 A1    4/2019   Umehara et al.

FOREIGN PATENT DOCUMENTS

CN    104073018 A    10/2014
CN    105367592 A    3/2016
(Continued)

OTHER PUBLICATIONS

Yuan et al., Organic Letters 2007 9 (12), 2313-2316 (Year: 2007).*

(Continued)

*Primary Examiner* — Jeffrey S Lundgren
*Assistant Examiner* — Anthony Joseph Seitz
(74) *Attorney, Agent, or Firm* — Muir Patent Law, PLLC

(57) ABSTRACT

An organic compound and an electronic device, the organic compound being represented by General Formula (1):

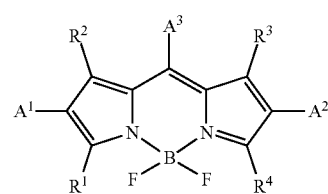

(1)

wherein, in General Formula (1), $R^1$, $R^2$, $R^3$, and $R^4$ are each independently a substituted or unsubstituted alkyl group having 1 to 4 carbon atoms, a substituted or unsubstituted alkoxy group having 1 to 4 carbon atoms, or a substituted or unsubstituted alkylthio group having 1 to 4 carbon atoms, $A^1$ and $A^2$ are each independently hydrogen, an aryl group including a ring that includes at least six members, or a heteroaryl group including a ring that includes at least five members, at least one of
(Continued)

$A^1$ and $A^2$ being an aryl group including a ring that includes at least six members or a heteroaryl group including a ring that includes at least five members, and $A^3$ is an aryl group including a ring that includes at least six members or a heteroaryl group including a ring that includes at least five members.

17 Claims, 6 Drawing Sheets

(51) Int. Cl.
*H10K 50/11* (2023.01)
*H10K 85/30* (2023.01)
*H10K 85/60* (2023.01)

(52) U.S. Cl.
CPC ....... *H10K 85/655* (2023.02); *H10K 85/6572* (2023.02); *H10K 85/6576* (2023.02); *H10K 30/30* (2023.02); *H10K 50/11* (2023.02)

(56) References Cited

FOREIGN PATENT DOCUMENTS

| | | | | |
|---|---|---|---|---|
| CN | 109503640 | A | 3/2019 | |
| EP | 3819953 | A1 * | 5/2021 | ........... H10K 85/658 |
| JP | 2010-013639 | A | 1/2010 | |
| JP | 5851268 | B2 | 2/2016 | |
| JP | 2018510127 | A | 4/2018 | |
| JP | 2018-146659 | A | 9/2018 | |
| JP | 2020072270 | A | 5/2020 | |
| KR | 10-1590299 | B1 | 2/2016 | |
| KR | 1020160079374 | A | 7/2016 | |
| KR | 10-2020-0049485 | A | 5/2020 | |
| WO | 2018047498 | A1 | 3/2018 | |
| WO | WO-2018038137 | A1 * | 3/2018 | ............. C09K 11/06 |

OTHER PUBLICATIONS

Gai et al., RSC Adv., 2012,2, 8840-8846 (Year: 2012).*
Peña-Cabrera et al., Organic Letters 2007 9 (20), 3985-3988 (Year: 2007).*
Sunahara et al., J. Am. Chem. Soc., vol. 129, pp. 5597-5604 (2007).
Algi, Melek Pamuk, et al., "Design and synthesis of new 4, 4'-difluoro-4-bora-3a, 4a-diaza-s-indacene based electrochromic polymers," Electrochimica Acta 109 (2013): 766-774.
Chen, Yinghui, et al., "Geometry relaxation-induced large Stokes shift in red-emitting borondipyrromethenes (BODIPY) and applications in fluorescent thiol probes," The Journal of organic chemistry 77.5 (2012): 2192-2206.
Epelde-Elezcano, Nerea, et al., "Rational design of advanced photosensitizers based on orthogonal BODIPY dimers to finely modulate singlet oxygen generation," Chemistry—A European Journal 23.20 (2017): 4837-4848.
Gai, Lizhi, et al., "Synthesis and spectroscopic properties of bodipy dimers with effective solid-state emission," RSC Advances 2.23 (2012): 8840-8846.

* cited by examiner

ORGANIC COMPOUND, ORGANIC PHOTOELECTRIC DEVICE, IMAGE SENSOR, AND ELECTRONIC DEVICE

CROSS-REFERENCE TO RELATED APPLICATION

Korean Patent Application No. 10-2020-0097863, filed on Aug. 5, 2020, in the Korean Intellectual Property Office, and entitled: "Organic Compound, Organic Photoelectric Device, Image Sensor, and Electronic Device," is incorporated by reference herein in its entirety.

BACKGROUND

1. Field

Embodiments relate to an organic compound, an organic photoelectric device, an image sensor, and an electronic device.

2. Description of the Related Art

Examples of a photoelectric device, which is a device that converts light into an electrical signal with the use of a photoelectric effect, may include a photodiode, an optical transistor, and the like and are applicable to an image sensor, a solar cell, and the like.

As the resolution of image sensors including photodiodes has increased, the size of pixels of the image sensors has decreased. In the case of a silicon (Si) photodiode, which is a photodiode formed of Si, as the pixel size of the Si photodiode decreases, the absorption area of the Si photodiode may decrease, and as a result, the sensitivity of the Si photodiode may also decrease.

SUMMARY

The embodiments may be realized by providing an organic compound represented by General Formula (1):

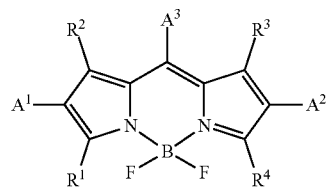

(1)

wherein, in General Formula (1), $R^1$, $R^2$, $R^3$, and $R^4$ are each independently a substituted or unsubstituted alkyl group having 1 to 4 carbon atoms, a substituted or unsubstituted alkoxy group having 1 to 4 carbon atoms, or a substituted or unsubstituted alkylthio group having 1 to 4 carbon atoms, $A^1$ and $A^2$ are each independently hydrogen, an aryl group including a ring that includes at least six members, or a heteroaryl group including a ring that includes at least five members, at least one of $A^1$ and $A^2$ being an aryl group including a ring that includes at least six members or a heteroaryl group including a ring that includes at least five members, and $A^3$ is an aryl group including a ring that includes at least six members or a heteroaryl group including a ring that includes at least five members.

The embodiments may be realized by providing an organic compound represented by General Formula (1):

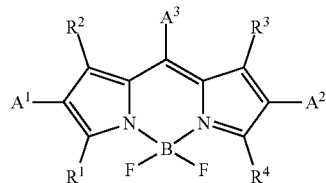

(1)

wherein, in General Formula (1), $R^1$, $R^2$, $R^3$, and $R^4$ are each independently a substituted or unsubstituted alkyl group having 1 to 4 carbon atoms, a substituted or unsubstituted alkoxy group having 1 to 4 carbon atoms, or a substituted or unsubstituted alkylthio group having 1 to 4 carbon atoms, $A^1$ and $A^2$ are each independently hydrogen, an aryl group including a ring that includes at least six members, or a heteroaryl group including a ring that includes at least five members, at least one of $A^1$ and $A^2$ being an aryl group including a ring that includes at least six members or a heteroaryl group including a ring that includes at least five members, and $A^3$ is an aryl group including a ring that includes at least six members or a heteroaryl group including a ring that includes at least five members, and wherein the organic compound has a maximum absorption wavelength ($\lambda$ max) of 530 nm to 560 nm.

The embodiments may be realized by providing an electronic device including first and second electrodes facing each other; and an active layer between the first and second electrodes, wherein the active layer includes an organic compound represented by General Formula (1):

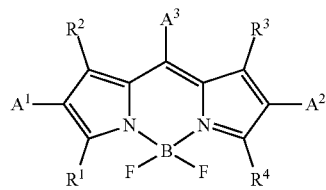

(1)

wherein, in General Formula (1), $R^1$, $R^2$, $R^3$, and $R^4$ are each independently a substituted or unsubstituted alkyl group having 1 to 4 carbon atoms, a substituted or unsubstituted alkoxy group having 1 to 4 carbon atoms, or a substituted or unsubstituted alkylthio group having 1 to 4 carbon atoms, $A^1$ and $A^2$ are each independently hydrogen, an aryl group including a ring that includes at least six members, or a heteroaryl group including a ring that includes at least five members, at least one of $A^1$ and $A^2$ being an aryl group including a ring that includes at least six members or a heteroaryl group including a ring that includes at least five members, and $A^3$ is an aryl group including a ring that includes at least six members or a heteroaryl group including a ring that includes at least five members.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
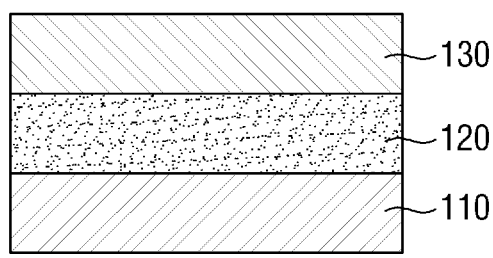
FIG. 1 is a cross-sectional view of an organic photoelectric device according to some embodiments of the present disclosure.

Organic compounds according to some embodiments of the present disclosure will hereinafter be described with reference to the embodiments, Production Examples, and Comparative Examples set forth herein.

The organic compound according to some embodiments of the present disclosure may be represented by General Formula (1).

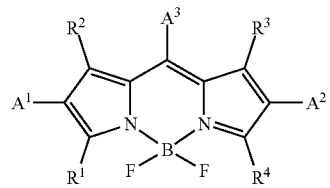

(1)

In General Formula (1), $R^1$, $R^2$, $R^3$, and $R^4$ may each independently be or include, e.g., a substituted or unsubstituted alkyl group having 1 to 4 carbon atoms, a substituted or unsubstituted alkoxy group having 1 to 4 carbon atoms, or a substituted or unsubstituted alkylthio group having 1 to 4 carbon atoms. The alkyl group having 1 to 4 carbon atoms may be, e.g., a methyl group, an ethyl group, an n-propyl group, an isopropyl group, an n-butyl group, an isobutyl group, a sec-butyl group, or a tert-butyl group. As used herein, the term "or" is not an exclusive term, e.g., "A or B" would include A, B, or A and B.

In an implementation, $R^1$, $R^2$, $R^3$, and $R^4$ may not include a ring structure. In an implementation, $R^1$, $R^2$, $R^3$, and $R^4$ may each independently be or include, e.g., a substituted or unsubstituted alkyl group having 1 to 3 carbon atoms. The alkyl group having 1 to 3 carbon atoms may be, e.g., a methyl group, an ethyl group, an n-propyl group, or an isopropyl group.

In an implementation, $R^1$, $R^2$, $R^3$, and $R^4$ may all represent the same substituent, e.g., $R^1$, $R^2$, $R^3$, and $R^4$ may be the same. In an implementation, $R^1$, $R^2$, $R^3$, and $R^4$ may all be methyl groups.

In General Formula (1), $A^1$ and $A^2$ may each independently be hydrogen or an aryl group including a ring that includes at least six members (e.g., may include a 6-membered ring, such as a benzene ring) or a heteroaryl group including a ring that includes at least five members (e.g., may include a 5-membered heterocyclic ring, such as a thiophene ring). In an implementation, at least one of $A^1$ and $A^2$ may be an aryl group including a ring that includes at least five members or a heteroaryl group including a ring that includes at least five members. In an implementation, at least one of $A^1$ and $A^2$ may be a heteroaryl group including a thiophene ring or an aryl group including a benzene ring.

In an implementation, at least one of $A^1$ and $A^2$ may be a substituted or unsubstituted thienyl group, a substituted or unsubstituted phenyl group, a substituted or unsubstituted naphthyl group, or a substituted or an unsubstituted benzothienyl group.

In an implementation, at least one of $A^1$ and $A^2$ may be a 2-thienyl group, a 5-methyl-2-thienyl group, a phenyl group, a 4-methylphenyl group, a 2-naphthyl group, 5-methyl-2-benzothienyl group, a 5-(2-thienyl)-2-thienyl group, or a 2, 4, 6-trimethylphenyl group. In an implementation, at least one of $A^1$ and $A^2$ may be a group of the following Group (2), in which <img is a bonding location.

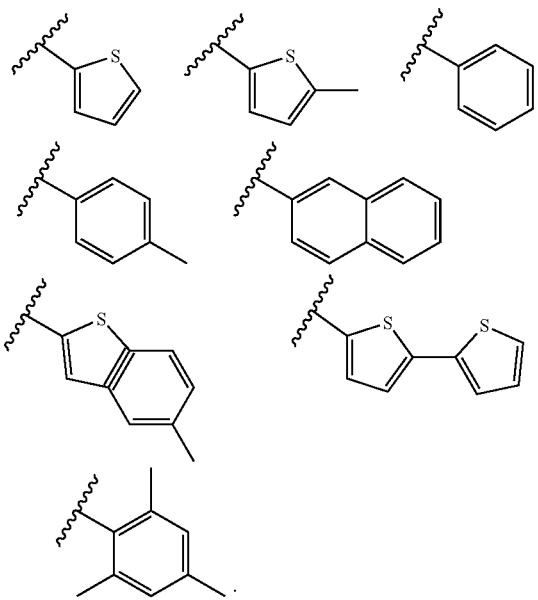

(2)

In an implementation, $A^1$ and $A^2$ may each independently be, e.g., a methylphenyl group or a tolyl group. In an implementation, $A^1$ and $A^2$ may each independently be, e.g., a 4-methylphenyl group or a p-tolyl group.

In General Formula (1), $A^3$ may be, e.g., an aryl group including a ring that includes at least five members or a heteroaryl group including a ring that includes at least five members.

In an implementation, $A^3$ may be, e.g., a heteroaryl group including a ring that includes at least five members and containing a sulfur atom. The heteroaryl group including a ring that includes at least five members and containing a sulfur atom may include, e.g., a monocyclic or fused-ring aromatic compound including at least one thiophene ring. The monocyclic aromatic compound including at least one thiophene ring may include, e.g., thiophene, thiazole, or thiadiazole. The fused-ring aromatic compound including at least one thiophene ring may include, e.g., benzothiophene, dibenzothiophene, dithienothiophene, benzodithiophene, thienothiophene, or dithienopyrrole.

In an implementation, $A^3$ may be an aryl group including a ring that includes at least six members (e.g., may include a 6-membered ring, such as a benzene ring). The ring that includes at least six members may include, e.g., a monocyclic or fused-ring aromatic compound including at least one benzene ring. The fused-ring aromatic compound including at least one benzene ring may include, e.g., naphthalene and anthracene.

In an implementation, $A^3$ may be one of the following groups, in which  is a bonding location.

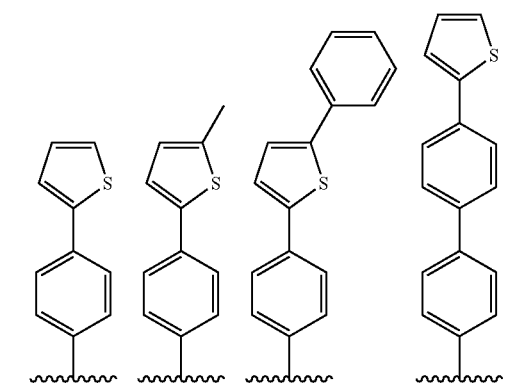

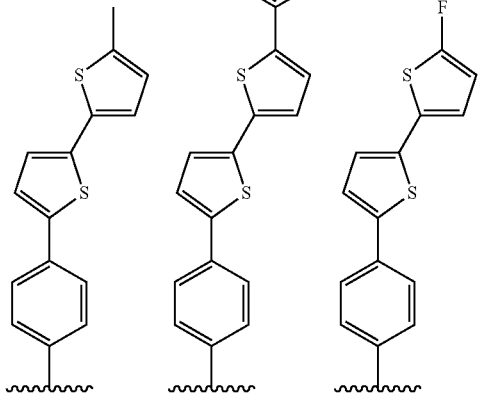

-continued

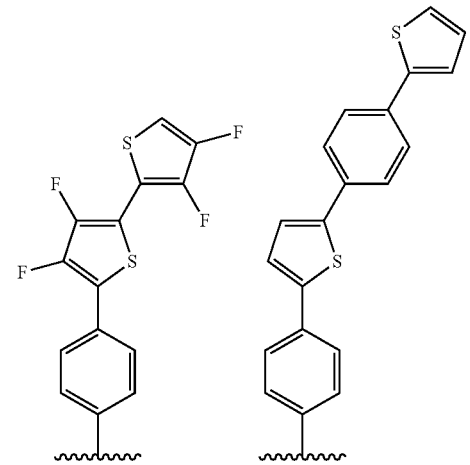

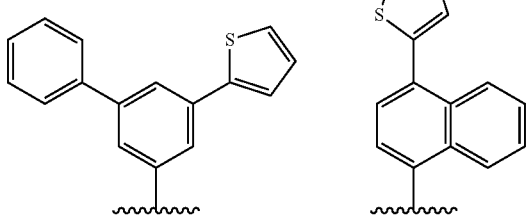

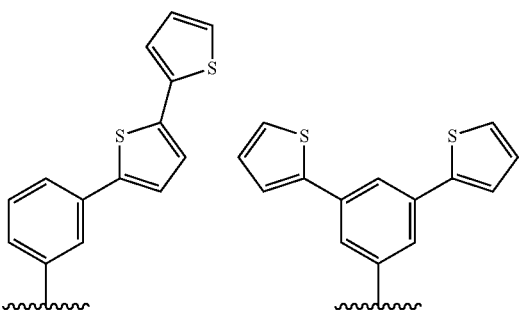

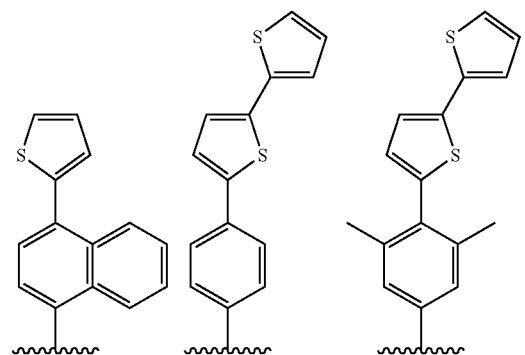

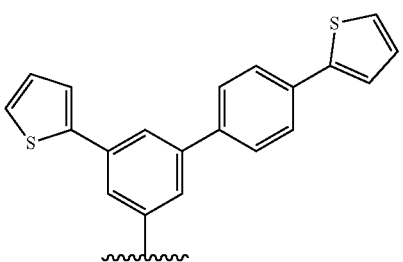

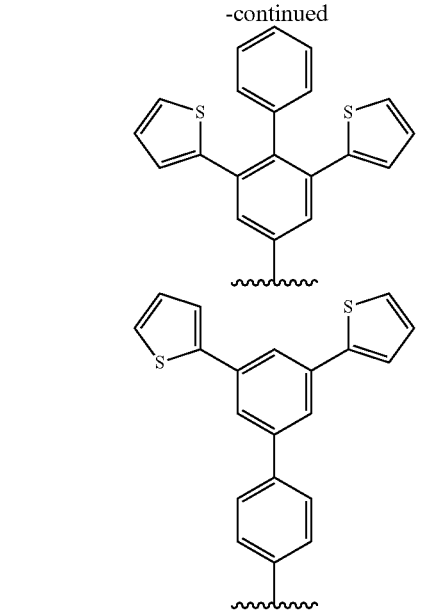
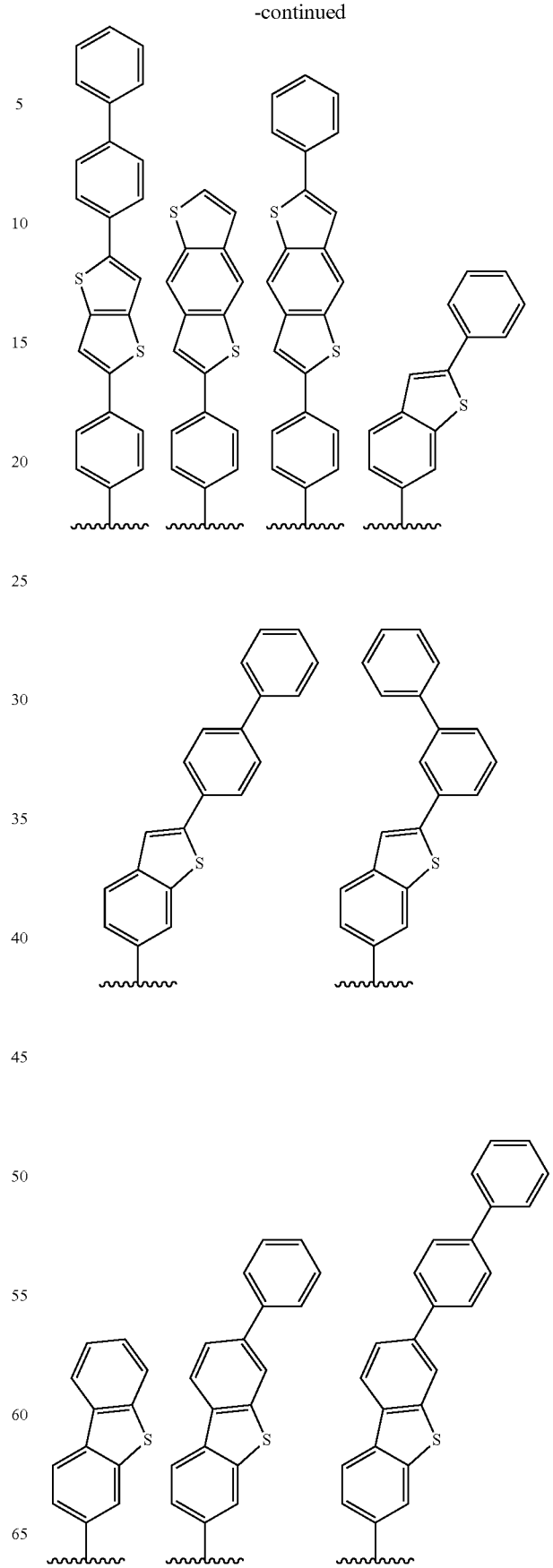

-continued

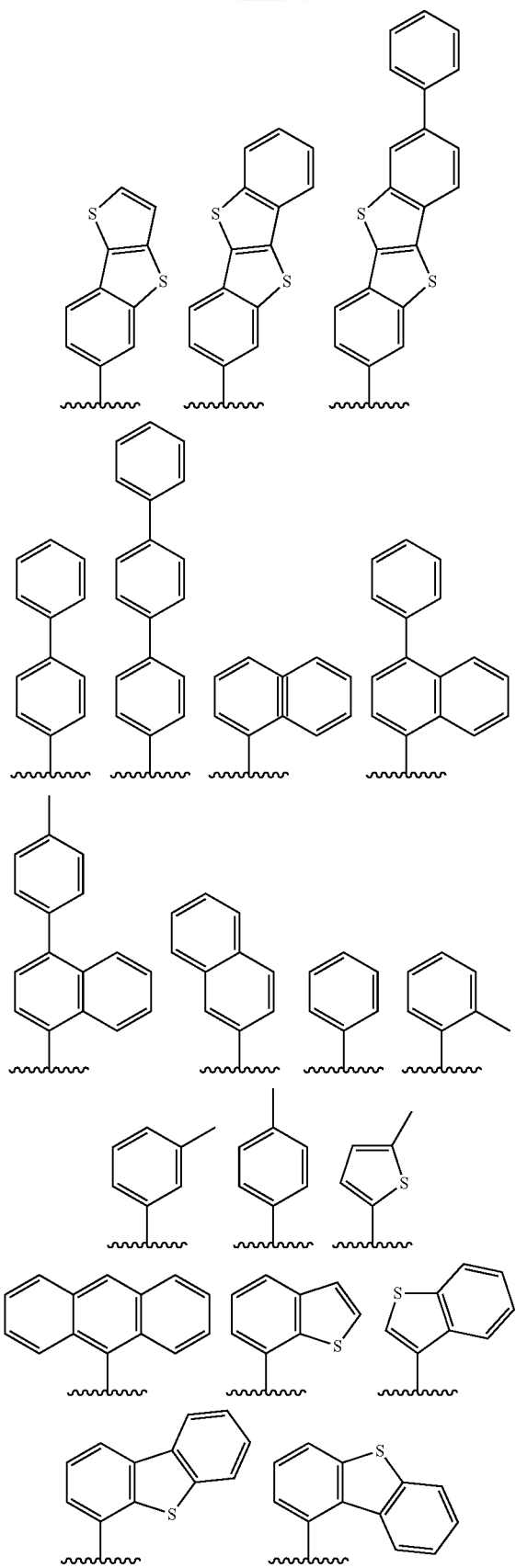

In an implementation, a (e.g., total) number of rings included in the organic compound represented by General Formula (1) may be 5 to 8. Maintaining the number of rings in the organic compound represented by General Formula (1) at 8 or fewer may help prevent deterioration of the stability of the organic compound, which could otherwise occur due to steric hindrance.

The organic compound represented by General Formula (1) may selectively absorb light of a green wavelength range. In an implementation, the organic compound represented by General Formula (1) may have a maximum absorption wavelength (λ max) (e.g., wavelength of maximum or peak absorbance) of about 530 nm to about 560 nm in a thin-film state. In an implementation, the organic compound represented by General Formula (1) may exhibit an absorption curve having a full-width-at-half-maximum (FWHM) of about 50 nm to about 110 nm in a thin-film state.

In an implementation, the green-wavelength external quantum efficiency (G-EQE) of an organic photoelectric device fabricated using the organic compound represented by General Formula (1) may be about 40% or higher, preferably about 50% or higher, more preferably about 60% or higher.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

[Experimental Example 1]—Synthesis of Formula 1

[Formula 1]

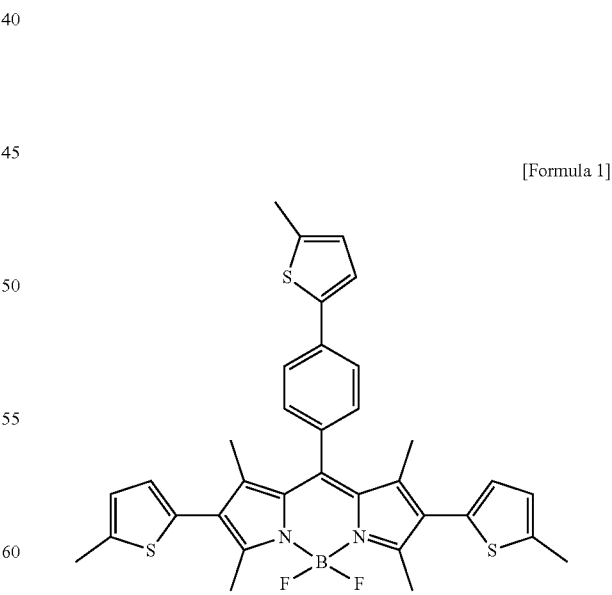

(IUPAC Name: 5,5-difluoro-1,3,7,9-tetramethyl-2,8-bis(5-methylthiophen-2-yl)-10-(4-(5-methylthiophen-2-yl)phenyl)-5H-4λ$^4$,5λ$^4$-dipyrrolo[1,2-c:2',1'-f][1,3,2]diazaborinine)

A compound of Formula 1 was synthesized according to Scheme 1 below.

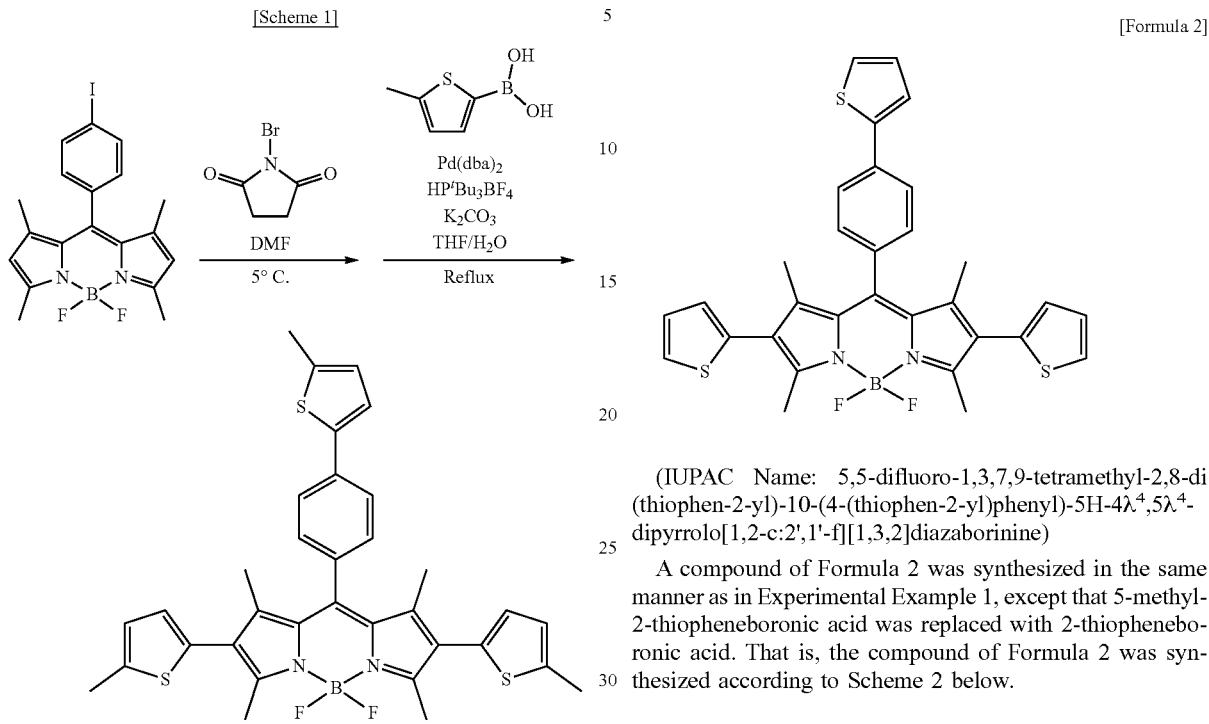

A reagent manufactured by Tokyo Chemical Industry Co., Ltd., was used as a raw material compound, 5,5-difluoro-10-(4-iodophenyl)-1,3,7,9-tetramethyl-5H-4$\lambda^4$,5$\lambda^4$-dipyrrolo[1,2-c:2',1'-f][1,3,2]diazaborinine.

In a 30 ml flask, a solution having, added thereto, 1.0 g (2.2 mmol) of 5,5-difluoro-10-(4-iodophenyl)-1,3,7,9-tetramethyl-5H-4$\lambda^4$,5$\lambda^4$-dipyrrolo[1,2-c:2',1'-f][1,3,2]diazaborinine and 20 g of N,N-dimethylformamide was cooled to a temperature of 5° C., and 0.86 g (4.8 mmol) of N-bromosuccinimide was added, followed by stirring for 4 hours. Thereafter, the solution was washed, and the oil layer was concentrated under reduced pressure to obtain 1.0 g of a red solid.

Thereafter, 0.74 g (5.2 mmol) of 5-methyl-2-thiopheneboronic acid, 0.15 g (0.26 mmol) of bis(dibenzylideneacetone)palladium, 0.15 g (0.51 mmol) of tri-tert-butylphosphonium tetrafluoroborate, 2.1 g (15.3 mmol) of potassium carbonate, 10 g of tetrahydrofuran, and 5.0 g of water were added to 1.0 g of the red solid, followed by heating and refluxing for 8 hours. Thereafter, the solution was cooled at ambient temperature and washed with toluene and water, and the oil layer was concentrated under reduced pressure, followed by sublimation purification, to obtain 0.19 g of the compound of Formula 1.

The preparation of the compound of Formula 1 was confirmed by $^1$H-NMR analysis.

$^1$H-NMR (CDCl$_3$, ppm):

δ=1.47 (s, 6H), 2.48 (s, 6H), 2.53 (s, 3H), 2.60 (s, 6H), 6.63 (d, J=3.6 Hz, 2H), 6.71 (dd, J=3.2, 1.2 Hz, 2H), 6.77 (d, J=2.4 Hz, 1H), 7.22 (d, J=3.6 Hz, 1H), 7.30 (d, J=8.0 Hz, 2H), 7.69 (d, J=8.4 Hz, 2H)

[Experimental Example 2]—Synthesis of Formula 2

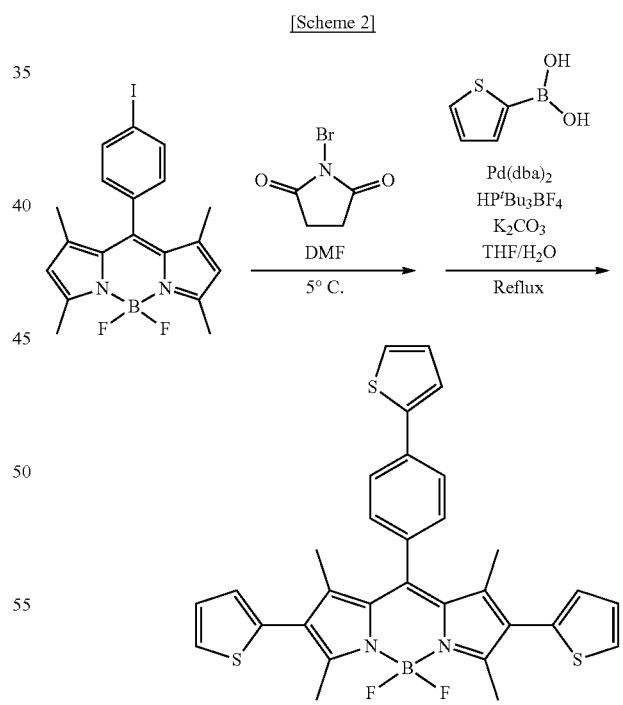

(IUPAC Name: 5,5-difluoro-1,3,7,9-tetramethyl-2,8-di(thiophen-2-yl)-10-(4-(thiophen-2-yl)phenyl)-5H-4$\lambda^4$,5$\lambda^4$-dipyrrolo[1,2-c:2',1'-f][1,3,2]diazaborinine)

A compound of Formula 2 was synthesized in the same manner as in Experimental Example 1, except that 5-methyl-2-thiopheneboronic acid was replaced with 2-thiopheneboronic acid. That is, the compound of Formula 2 was synthesized according to Scheme 2 below.

The preparation of the compound of Formula 2 was confirmed by $^1$H-NMR analysis.

$^1$H-NMR (CDCl$_3$, ppm):

δ=1.48 (s, 6H), 2.61 (s, 6H), 6.86 (dd, J=3.6, 0.8 Hz, 2H), 7.06-7.10 (m, 2H), 7.10-7.14 (m, 1H), 7.32-7.36 (m, 5H), 7.43 (d, J=3.6 Hz, 1H), 7.78 (d, J=8.0 Hz, 2H)

[Experimental Example 3]—Synthesis of Formula 3

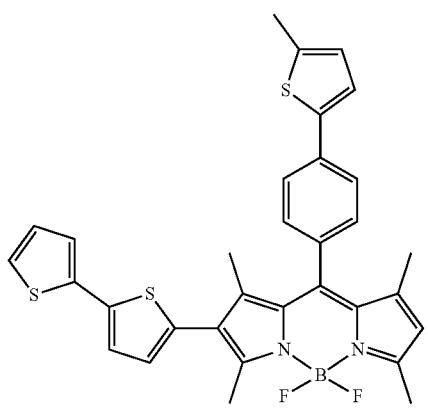

[Formula 3]

(IUPAC Name: 2-([2,2'-bithiophen]-5-yl)-5,5-difluoro-1,3,7,9-tetramethyl-10-(4-(5-methylthiophen-2-yl)phenyl)-5H-4λ$^4$,5λ$^4$-dipyrrolo[1,2-c:2',1'-f][1,3,2]diazaborinine)

A compound of Formula 3 was synthesized according to Scheme 3 below.

5-methyl-2-thiopheneboronic acid, 65 mg (0.11 mmol) of bis(dibenzylideneacetone)palladium, 65 mg (0.22 mmol) of tri-tert-butylphosphonium tetrafluoroborate, 0.80 g (5.8 mmol) of potassium carbonate, 10 g of tetrahydrofuran, and 5.0 g of water were added, followed by heating and refluxing for 8 hours. Thereafter, the solution was cooled at ambient temperature and washed with toluene and water, and the oil layer was concentrated under reduced pressure to obtain 0.9 g of a red solid.

Thereafter, a solution obtained by adding 20 g of N,N-dimethylformamide to 0.90 g of the red solid was cooled to a temperature of 5° C., and 0.39 g (2.2 mmol) of N-bromosuccinimide was added, followed by stirring for 4 hours. Thereafter, the solution was washed with water, and the oil layer was concentrated to obtain 0.9 g of a red solid.

Thereafter, 0.68 g of 5-(4,4,5,5-tetramethyl-1,3,2-dioxaborolane-2-yl)-2,2'-bithiophene, 0.052 g (0.09 mmol) of bis(dibenzylideneacetone)palladium, 0.052 g (0.18 mmol) of tri-tert-butylphosphonium tetrafluoroborate, 0.75 g (5.4 mmol) of potassium carbonate, 10 g of tetrahydrofuran, and 5.0 g of water were added, followed by heating and refluxing for 8 hours. Thereafter, the solution was cooled at ambient temperature and washed with toluene and water, and the oil layer was concentrated under reduced pressure, followed by sublimation purification, to obtain 0.3 g of the compound of Formula 3.

[Scheme 3]

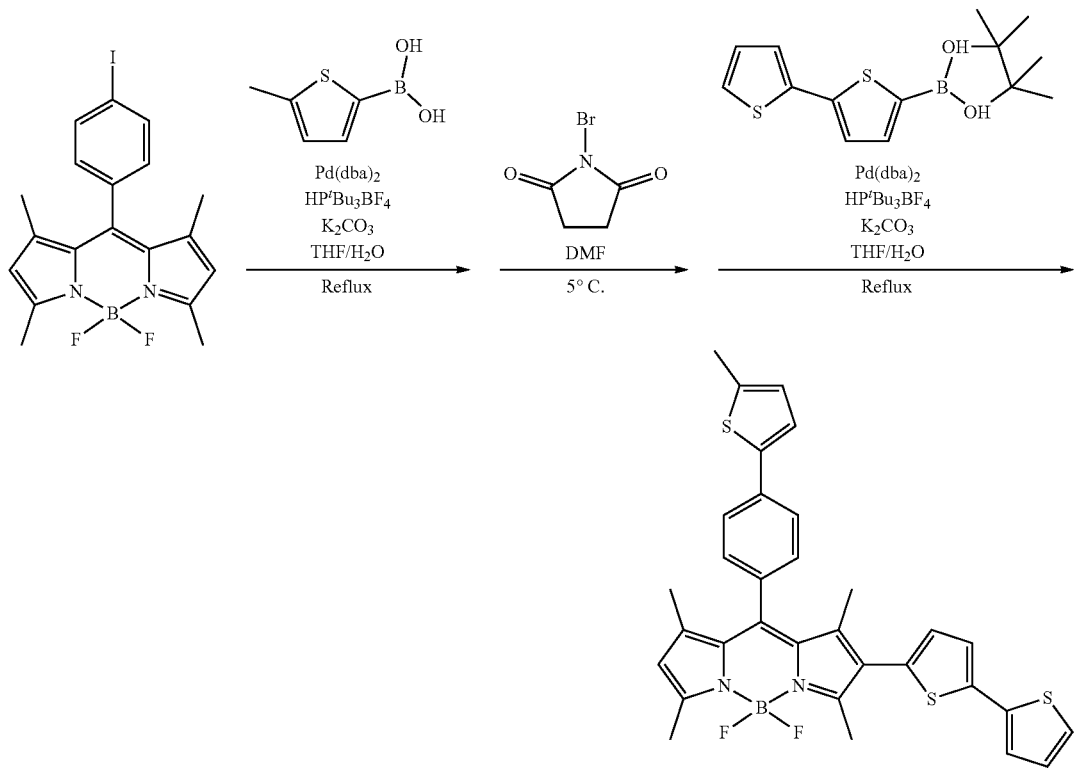

A reagent manufactured by Tokyo Chemical Industry Co., Ltd was used as a raw material compound, 5,5-difluoro-10-(4-iodophenyl)-1,3,7,9-tetramethyl-5H-4λ$^4$,5λ$^4$-dipyrrolo[1,2-c:2',1'-f][1,3,2]diazaborinine.

In a 30 ml flask, 1.0 g (2.2 mmol) of 5,5-difluoro-10-(4-iodophenyl)-1,3,7,9-tetramethyl-5H-4λ$^4$,5λ$^4$-dipyrrolo[1,2-c:2',1'-f][1,3,2]diazaborinine, 0.45 g (3.2 mmol) of The preparation of the compound of Formula 3 was confirmed by $^1$H-NMR analysis.

$^1$H-NMR (CDCl$_3$, ppm):

δ=1.49 (s, 3H), 1.50 (s, 3H), 2.54 (s, 3H), 2.59 (s, 3H), 2.63 (s, 3H), 6.04 (s, 1H), 6.74 (d, J=3.6 Hz, 1H), 6.77 (d, J=2.4 Hz, 1H), 6.98-7.02 (m, 1H), 7.13 (d, J=3.6 Hz, 1H), 7.14 (dd, J=3.6, 1.2 Hz, 1H), 7.20 (dd, J=5.2, 1.2 Hz, 1H), 7.23 (d, J=3.6 Hz, 1H), 7.28 (d, J=8.4 Hz, 2H), 7.70 (d, J=8.4 Hz, 2H)

[Experimental Example 4]—Synthesis of Formula 4

[Formula 4]

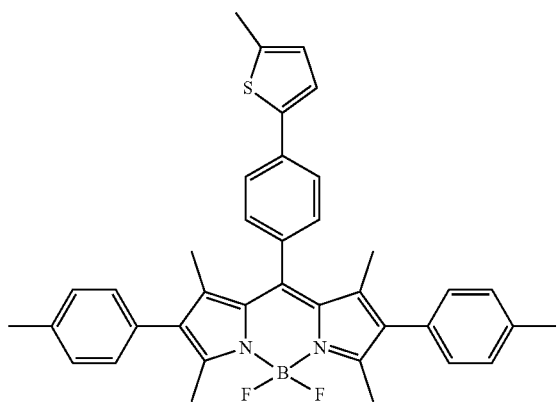

(IUPAC Name: 5,5-difluoro-1,3,7,9-tetramethyl-10-(4-(5-methylthiophen-2-yl)phenyl)-2,8-di-p-tolyl-5H-4λ$^4$,5λ$^4$-dipyrrolo[1,2-c:2',1'-f][1,3,2]diazaborinine)

A compound of Formula 4 was synthesized in the same manner as in Experimental Example 3, except that 5-(4,4,5,5-tetramethyl-1,3,2-dioxaborolane-2-yl)-2,2'-bithiophene was replaced with 4-methylphenylboronic acid. That is, the compound of Formula 4 was synthesized according to Scheme 4 below.

The preparation of the compound of Formula 4 was confirmed by $^1$H-NMR analysis.

$^1$H-NMR (CDCl$_3$, ppm):
δ=1.39 (s, 6H), 2.37 (s, 6H), 2.52 (s, 3H), 2.53 (s, 6H), 6.75 (dd, J=3.6, 0.9 Hz, 1H), 7.05 (d, J=10.0 Hz, 4H), 7.20 (d, J=10.0 Hz, 4H), 7.22 (s, 1H), 7.32 (d, J=10.0 Hz, 2H), 7.68 (d, J=10.0 Hz, 2H)

[Experimental Example 5]—Synthesis of Formula 5

[Formula 5]

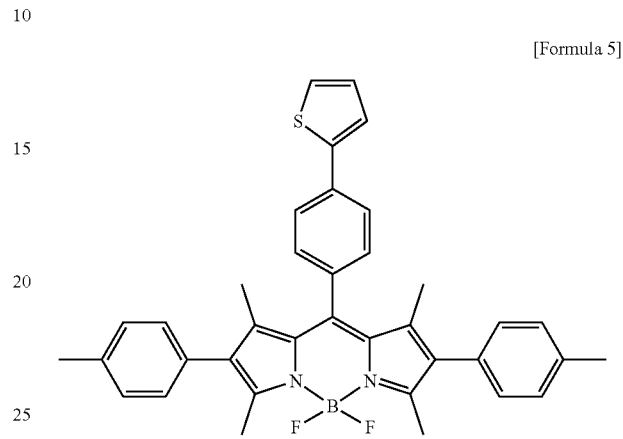

(IUPAC Name: 5,5-difluoro-1,3,7,9-tetramethyl-10-(4-(thiophen-2-yl)phenyl)-2,8-di-p-tolyl-5H-4λ$^4$,5λ$^4$-dipyrrolo[1,2-c:2',1'-f][1,3,2]diazaborinine)

A compound of Formula 5 was synthesized in the same manner as in Experimental Example 4, except that 5-methyl-2-thiopheneboronic acid was replaced with 2-thiopheneboronic acid. That is, the compound of Formula 5 was synthesized according to Scheme 5 below.

[Scheme 4]

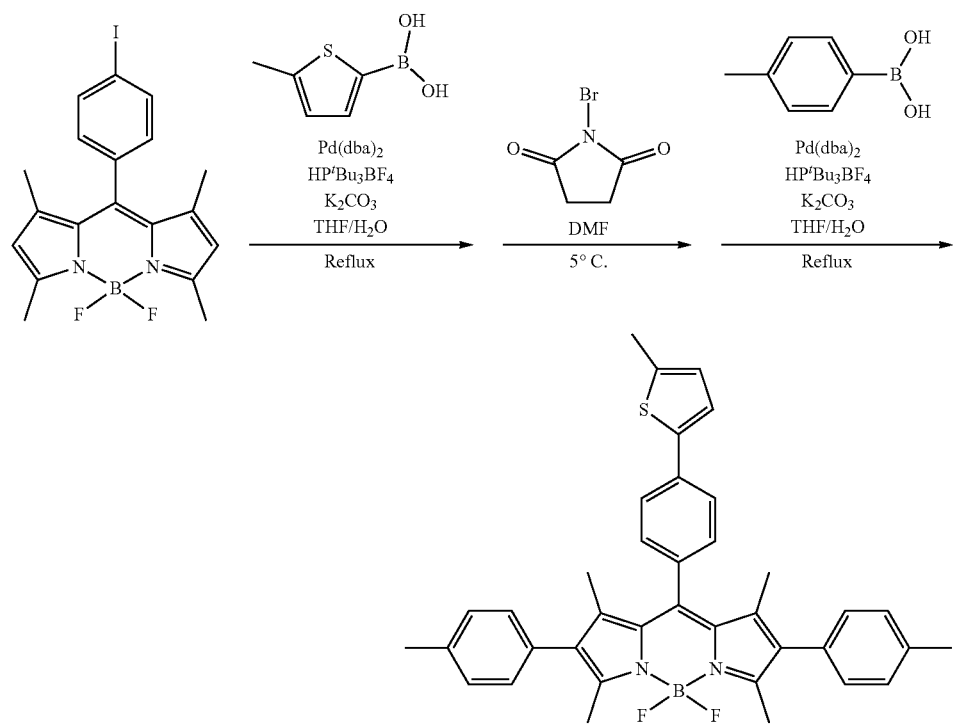

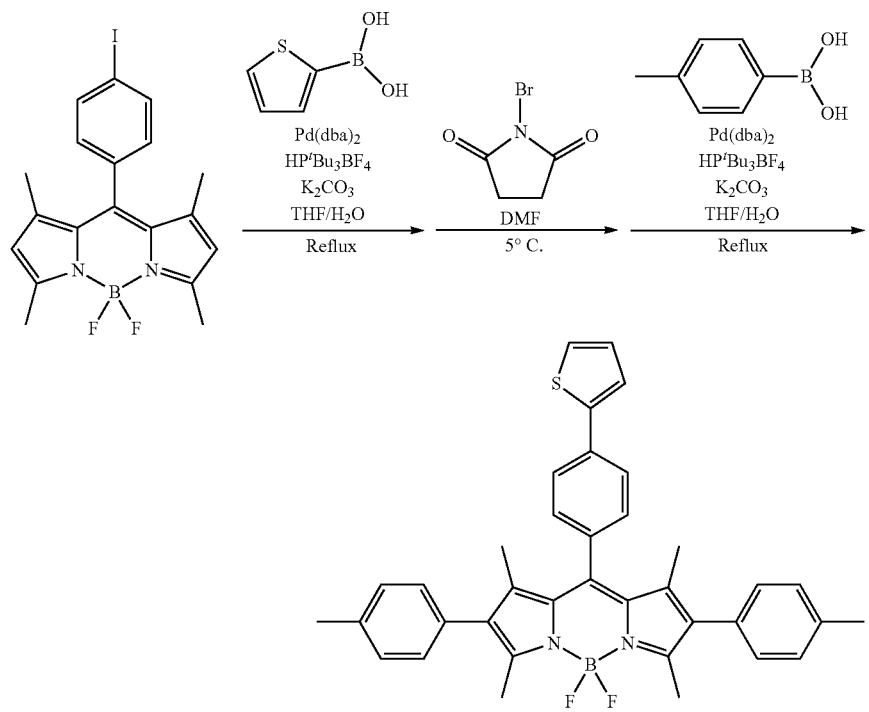

The preparation of the compound of Formula 5 was confirmed by $^1$H-NMR analysis.

$^1$H-NMR (CDCl$_3$, ppm):

δ=1.39 (s, 6H), 2.37 (s, 6H), 2.54 (s, 6H), 7.06 (d, J=8.4 Hz, 4H), 7.10-7.13 (m, 1H), 7.20 (d, J=7.6 Hz, 4H), 7.33 (d, J=5.2 Hz, 1H), 7.36 (d, J=8.4 Hz, 2H), 7.42 (d, J=3.6, 1H), 7.76 (d, J=8.4 Hz, 2H)

[Experimental Example 6]—Synthesis of Formula 6

[Formula 6]

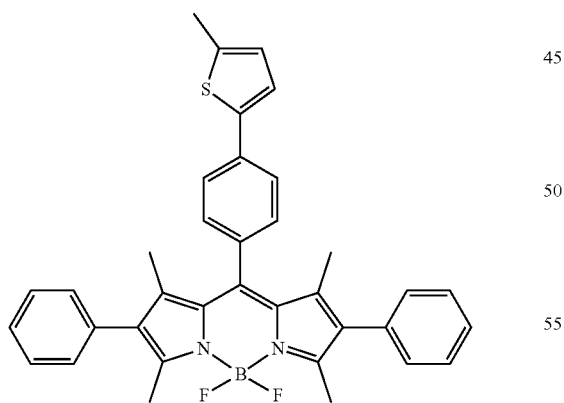

(IUPAC Name: 5,5-difluoro-1,3,7,9-tetramethyl-10-(4-(5-methylthiophen-2-yl)phenyl)-2,8-diphenyl-5H-4λ$^4$,5λ$^4$-dipyrrolo[1,2-c:2',1'-f][1,3,2]diazaborinine)

A compound of Formula 6 was synthesized in the same manner as in Experimental Example 4, except that 4-methylphenylboronic acid was replaced with phenylboronic acid. That is, the compound of Formula 6 was synthesized according to Scheme 6 below.

[Scheme 6]

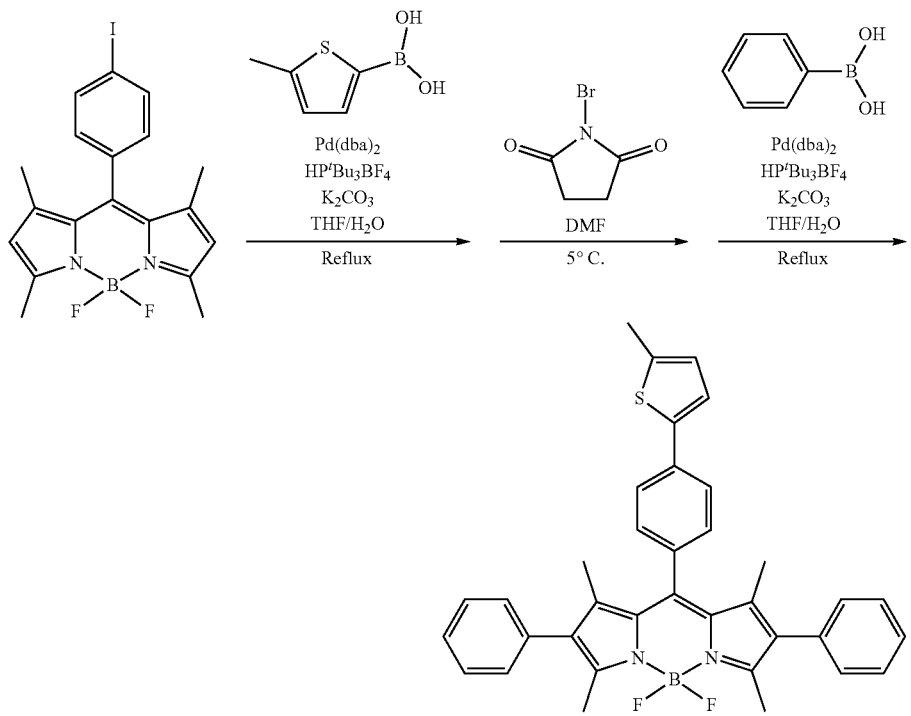

The preparation of the compound of Formula 6 was confirmed by $^1$H-NMR analysis.

$^1$H-NMR (CDCl$_3$, ppm):

δ=1.40 (s, 6H), 2.52 (s, 6H), 2.54 (s, 3H), 6.76 (d, J=2.4 Hz, 1H), 7.15-7.18 (m, 4H), 7.21 (d, J=3.6 Hz, 1H), 7.30-7.44 (m, 8H), 7.69 (d, J=8.0 Hz, 2H)

[Experimental Example 7]—Synthesis of Formula 7

[Formula 7]

(IUPAC Name: 5,5-difluoro-1,3,7,9-tetramethyl-10-phenyl-2,8-di-p-tolyl-5H-4λ$^4$,5λ$^4$-dipyrrolo[1,2-c:2',1'-f][1,3,2]diazaborinine)

A compound of Formula 7 was synthesized in the same manner as in Experimental Example 1, except that 5,5-difluoro-1,3,7,9-tetramethyl-10-phenyl-5H-4λ$^4$,5λ$^4$-dipyrrolo[1,2-c:2',1'-f][1,3,2]diazaborinine, instead of 5,5-difluoro-10-(4-iodophenyl)-1,3,7,9-tetramethyl-5H-4λ$^4$,5λ$^4$-dipyrrolo[1,2-c:2',1'-f][1,3,2]diazaborinine, was used as a raw material compound, and that 5-methyl-2-thiopheneboronic acid was replaced with 4-methylphenylboronic acid. A reagent manufactured by Merck & Co., Inc., was used as the raw material compound, 5,5-difluoro-1,3,7,9-tetramethyl-10-phenyl-5H-4λ$^4$,5λ$^4$-dipyrrolo[1,2-c:2',1'-f][1,3,2]diazaborinine. That is, the compound of Formula 7 was synthesized according to Scheme 7 below.

[Scheme 7]

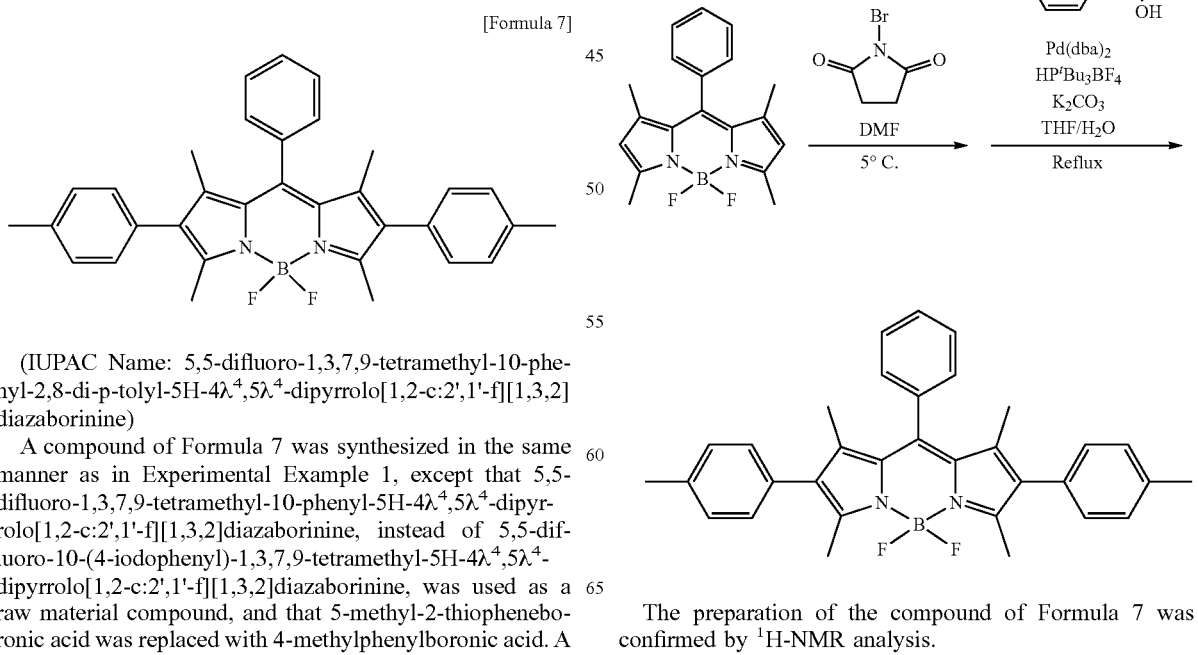

The preparation of the compound of Formula 7 was confirmed by $^1$H-NMR analysis.

¹H-NMR (CDCl₃, ppm):

δ=1.30 (s, 6H), 2.37 (s, 6H), 2.53 (s, 6H), 7.05 (d, J=8.1 Hz, 4H), 7.19 (d, J=7.7 Hz, 4H), 7.35 (dd, J1=7.5 Hz, J2=1.9 Hz, 2H), 7.45-7.52 (m, 3H)

[Experimental Example 8]—Synthesis of Formula 8

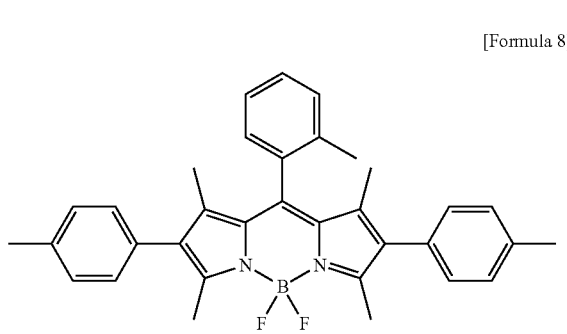

[Formula 8]

(IUPAC Name: 5,5-difluoro-1,3,7,9-tetramethyl-10-(o-tolyl)-2,8-di-p-tolyl-5H-4λ⁴,5λ⁴-dipyrrolo[1,2-c:2',1'-f][1,3,2]diazaborinine)

A compound of Formula 8 was synthesized in the same manner as in Experimental Example 7, except that 5,5-difluoro-1,3,7,9-tetramethyl-10-(o-tolyl)-5H-4λ⁴,5λ⁴-dipyrrolo[1,2-c:2',1'-f][1,3,2]diazaborinine, instead of 5,5-difluoro-1,3,7,9-tetramethyl-10-phenyl-5H-4λ⁴,5λ⁴-dipyrrolo[1,2-c:2',1'-f][1,3,2]diazaborinine, was used as a raw material compound. The raw material compound, 5,5-difluoro-1,3,7,9-tetramethyl-10-(o-tolyl)-5H-4λ⁴,5λ⁴-dipyrrolo[1,2-c:2',1'-f][1,3,2]diazaborinine, was synthesized according to the method set forth in Journal of the American Chemical Society, 129 (17), 5597-5604 (2007). That is, the compound of Formula 8 was synthesized according to Scheme 8 below.

¹H-NMR (CDCl₃, ppm):

δ=1.29 (s, 6H), 2.28 (s, 3H), 2.37 (s, 6H), 2.54 (s, 6H), 7.06 (d, J=10.0 Hz, 4H), 7.20 (d, J=10.0 Hz, 4H), 7.21-7.38 (m, 4H)

[Experimental Example 9]—Synthesis of Formula 9

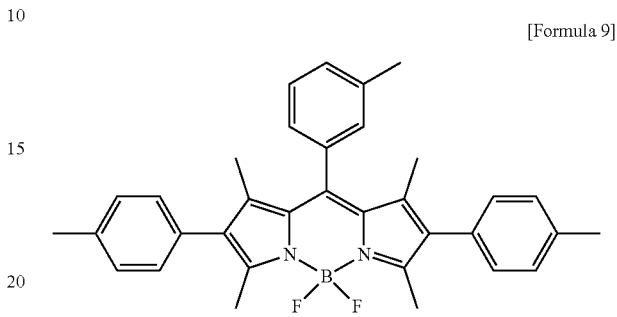

[Formula 9]

(IUPAC Name: 5,5-difluoro-1,3,7,9-tetramethyl-10-(m-tolyl)-2,8-di-p-tolyl-5H-4λ⁴,5λ⁴-dipyrrolo[1,2-c:2',1'-f][1,3,2]diazaborinine)

A compound of Formula 9 was synthesized in the same manner as in Experimental Example 7, except that 5,5-difluoro-1,3,7,9-tetramethyl-10-(m-tolyl)-5H-4λ⁴,5λ⁴-dipyrrolo[1,2-c:2',1'-f][1,3,2]diazaborinine, instead of 5,5-difluoro-1,3,7,9-tetramethyl-10-phenyl-5H-4λ⁴,5λ⁴-dipyrrolo[1,2-c:2',1'-f][1,3,2]diazaborinine, was used as a raw material compound. The raw material compound, 5,5-difluoro-1,3,7,9-tetramethyl-10-(m-tolyl)-5H-4λ⁴,5λ⁴-dipyrrolo[1,2-c:2',1'-f][1,3,2]diazaborinine, was synthesized according to the same method as that set forth in Journal of the American Chemical Society, 129 (17), 5597-5604 (2007), except that o-tolualdehyde was replaced with m-tolualdehyde. That is, the compound of Formula 9 was synthesized according to Scheme 9 below.

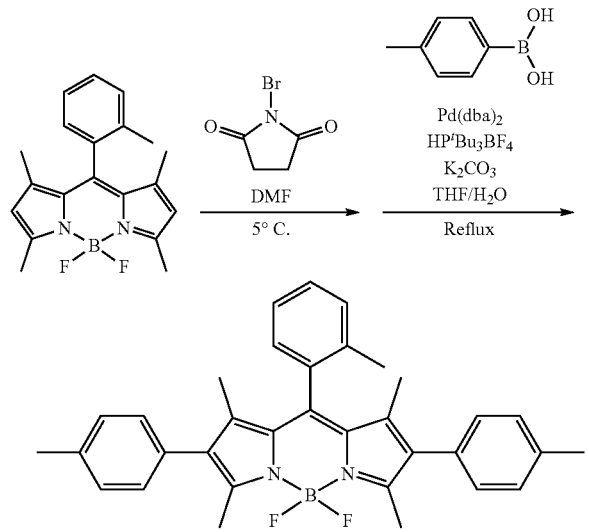

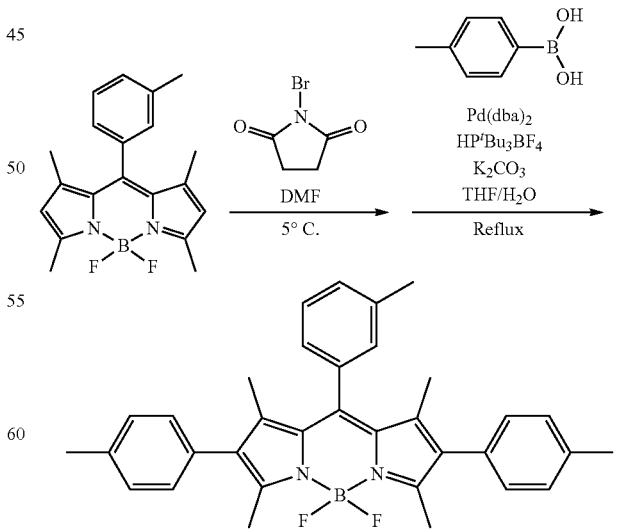

The preparation of the compound of Formula 8 was confirmed by ¹H-NMR analysis.

The preparation of the compound of Formula 9 was confirmed by ¹H-NMR analysis.

¹H-NMR (CDCl₃, ppm):
δ=1.32 (s, 6H), 2.37 (s, 6H), 2.39 (s, 3H), 2.53 (s, 6H), 7.05 (d, J=10.0 Hz, 4H), 7.19 (d, J=10.0 Hz, 4H), 7.12-7.39 (m, 4H)

[Experimental Example 10]—Synthesis of Formula 10

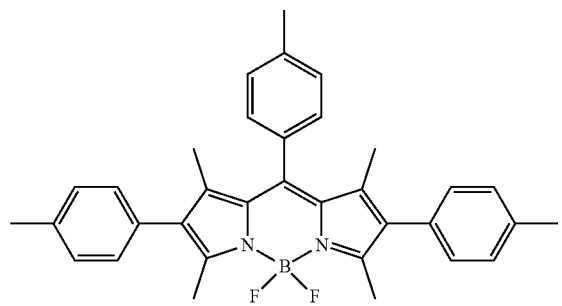

[Formula 10]

(IUPAC Name: 5,5-difluoro-1,3,7,9-tetramethyl-2,8,10-tri-p-tolyl-5H-4λ⁴,5λ⁴-dipyrrolo[1,2-c:2',1'-f][1,3,2]diazaborinine)

A compound of Formula 10 was synthesized in the same manner as in Experimental Example 7, except that 5,5-difluoro-1,3,7,9-tetramethyl-10-(naphthalen-1-yl)-5H-4λ⁴,5λ⁴-dipyrrolo[1,2-c:2',1'-f][1,3,2]diazaborinine, instead of 5,5-difluoro-1,3,7,9-tetramethyl-10-phenyl-5H-4λ⁴,5λ⁴-dipyrrolo[1,2-c:2',1'-f][1,3,2]diazaborinine, was used as a raw material compound. The raw material compound, 5,5-difluoro-1,3,7,9-tetramethyl-10-(p-tolyl)-5H-4λ⁴,5λ⁴-dipyrrolo[1,2-c:2',1'-f][1,3,2]diazaborinine, was synthesized according to the same method as that set forth in Journal of the American Chemical Society, 129 (17), 5597-5604 (2007), except that o-tolualdehyde was replaced with p-tolualdehyde. That is, the compound of Formula 10 was synthesized according to Scheme 10 below.

The preparation of the compound of Formula 10 was confirmed by ¹H-NMR analysis.
¹H-NMR (CDCl₃, ppm):
δ=1.32 (s, 6H), 2.37 (s, 6H), 2.42 (s, 3H), 2.53 (s, 6H), 7.05 (d, J=10.0 Hz, 4H), 7.19 (d, J=10.0 Hz, 4H), 7.18-7.30 (m, 4H)

[Experimental Example 11]—Synthesis of Formula 11

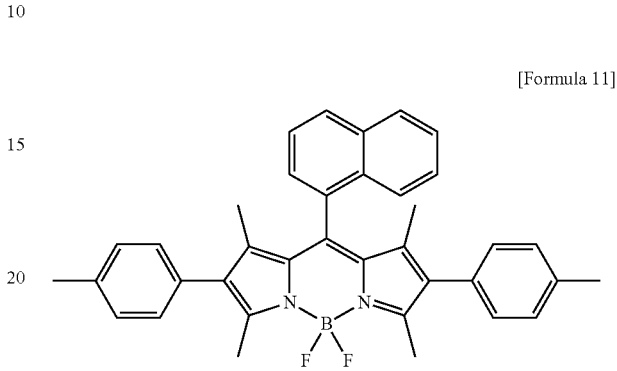

[Formula 11]

(IUPAC Name: 5,5-difluoro-1,3,7,9-tetramethyl-10-(naphthalen-1-yl)-2,8-di-p-tolyl-5H-4λ⁴,5λ⁴-dipyrrolo[1,2-c:2',1'-f][1,3,2]diazaborinine)

A compound of Formula 11 was synthesized in the same manner as in Experimental Example 7, except that 5,5-difluoro-1,3,7,9-tetramethyl-10-(naphthalen-1-yl)-5H-4λ⁴,5λ⁴-dipyrrolo[1,2-c:2',1'-f][1,3,2]diazaborinine, instead of 5,5-difluoro-1,3,7,9-tetramethyl-10-phenyl-5H-4λ⁴,5λ⁴-dipyrrolo[1,2-c:2',1'-f][1,3,2]diazaborinine, was used as a raw material compound. The raw material compound, 5,5-difluoro-1,3,7,9-tetramethyl-10-(naphthalen-1-yl)-5H-4λ⁴,5λ⁴-dipyrrolo[1,2-c:2',1'-f][1,3,2]diazaborinine, was synthesized according to the same method as that set forth in Journal of the American Chemical Society, 129 (17), 5597-5604 (2007), except that o-tolualdehyde was replaced with 1-naphthaldehyde. That is, the compound of Formula 11 was synthesized according to Scheme 11 below.

[Scheme 10]

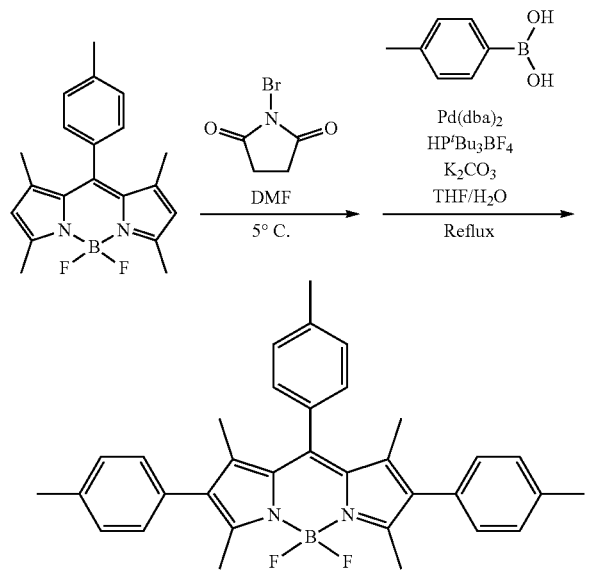

[Scheme 11]

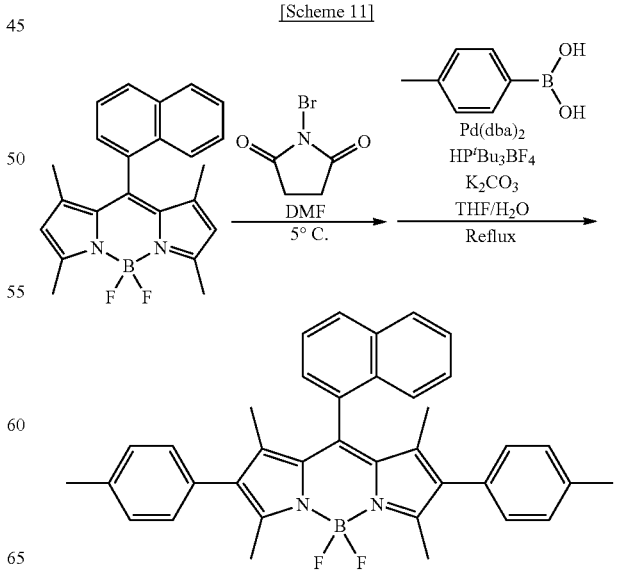

The preparation of the compound of Formula 11 was confirmed by $^1$H-NMR analysis.

$^1$H-NMR (CDCl$_3$, ppm):

δ=0.98 (s, 6H), 2.34 (s, 6H), 2.57 (s, 6H), 7.01 (d, J=7.9 Hz, 4H), 7.15 (d, J=7.9 Hz, 4H), 7.46-7.54 (m, 3H), 7.57 (t, J=7.6 Hz, 1H), 7.88 (d, J=7.3 Hz, 1H), 7.91-7.96 (m, 2H)

[Experimental Example 12]—Synthesis of Formula 12

[Formula 12]

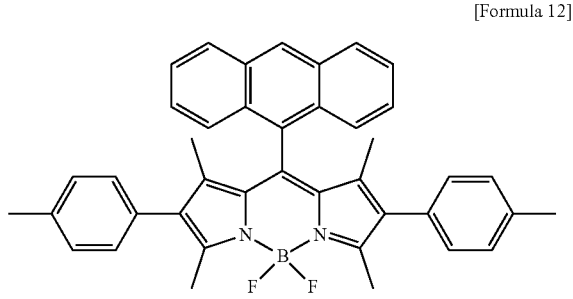

(IUPAC Name: 10-(anthracen-9-yl)-5,5-difluoro-1,3,7,9-tetramethyl-2,8-di-p-tolyl-5H-4λ$^4$,5λ$^4$-dipyrrolo[1,2-c:2',1'-f][1,3,2]diazaborinine)

A compound of Formula 12 was synthesized in the same manner as in Experimental Example 7, except that 10-(anthracen-9-yl)-5,5-difluoro-1,3,7,9-tetramethyl-5H-4λ$^4$,5λ$^4$-dipyrrolo[1,2-c:2',1'-f][1,3,2]diazaborinine, instead of 5,5-difluoro-1,3,7,9-tetramethyl-10-phenyl-5H-4λ$^4$,5λ$^4$-dipyrrolo[1,2-c:2',1'-f][1,3,2]diazaborinine, was used as a raw material compound. The raw material compound, 10-(anthracen-9-yl)-5,5-difluoro-1,3,7,9-tetramethyl-5H-4λ$^4$,5λ$^4$-dipyrrolo[1,2-c:2',1'-f][1,3,2]diazaborinine, was synthesized according to the same method as that set forth in Journal of the American Chemical Society, 129 (17), 5597-5604 (2007), except that o-tolualdehyde was replaced with anthracene-9-carbaldehyde. That is, the compound of Formula 12 was synthesized according to Scheme 12 below.

[Scheme 12]

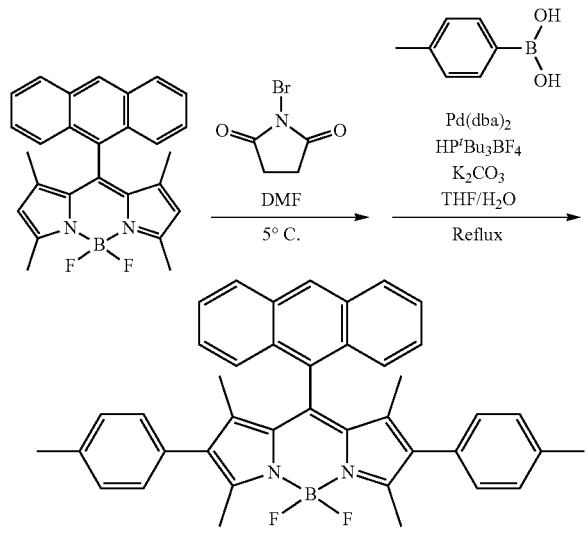

The preparation of the compound of Formula 12 was confirmed by $^1$H-NMR analysis.

$^1$H-NMR (CDCl$_3$, ppm):

δ=0.58 (s, 6H), 2.31 (s, 6H), 2.61 (s, 6H), 6.95 (d, J=8.0 Hz, 4H), 7.10 (d, J=8.0 Hz, 4H), 7.48 (m, 4H), 8.03 (s, 4H), 8.57 (s, 1H)

[Experimental Example 13]—Synthesis of Formula 13

[Formula 13]

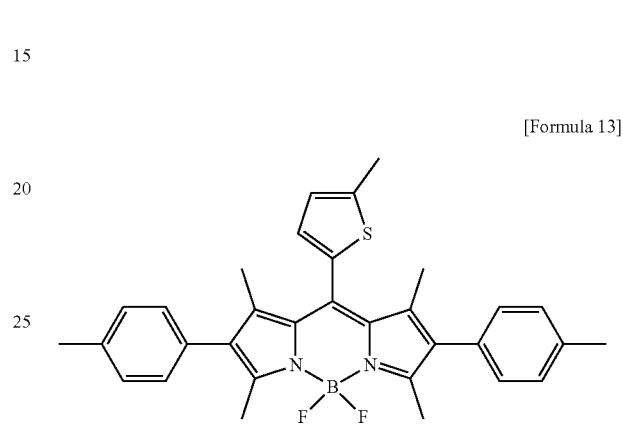

(IUPAC Name: 5,5-difluoro-1,3,7,9-tetramethyl-10-(5-methylthiophen-2-yl)-2,8-di-p-tolyl-5H-4λ$^4$,5λ$^4$-dipyrrolo[1,2-c:2',1'-f][1,3,2]diazaborinine)

A compound of Formula 13 was synthesized in the same manner as in Experimental Example 7, except that 5,5-difluoro-1,3,7,9-tetramethyl-10-(5-methylthiophene-2-yl)-5H-4λ$^4$,5λ$^4$-dipyrrolo[1,2-c:2',1'-f][1,3,2]diazaborinine, instead of 5,5-difluoro-1,3,7,9-tetramethyl-10-phenyl-5H-4λ$^4$,5λ$^4$-dipyrrolo[1,2-c:2',1'-f][1,3,2]diazaborinine, was used as a raw material compound. The raw material compound, 5,5-difluoro-1,3,7,9-tetramethyl-10-(5-methylthiophene-2-yl)-5H-4λ$^4$,5λ$^4$-dipyrrolo[1,2-c:2',1'-f][1,3,2]diazaborinine, was synthesized according to the same method as that set forth in Journal of the American Chemical Society, 129 (17), 5597-5604 (2007), except that o-tolualdehyde was replaced with 5-methylthiophene-2-carboxaldehyde. That is, the compound of Formula 13 was synthesized according to Scheme 13 below.

[Scheme 13]

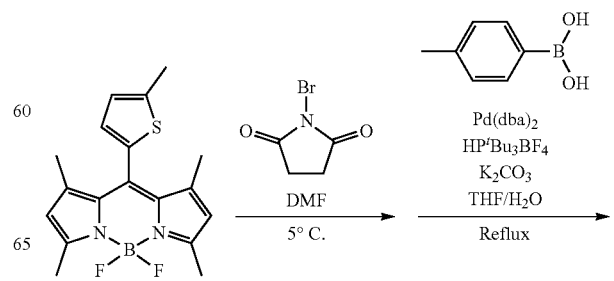

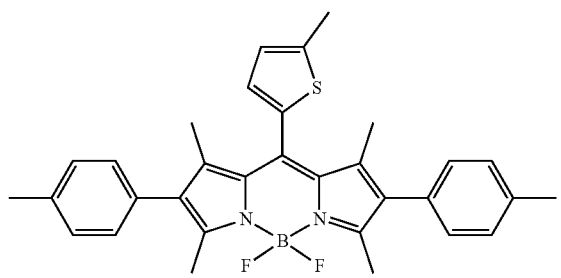

The preparation of the compound of Formula 13 was confirmed by ¹H-NMR analysis.

¹H-NMR (CDCl₃, ppm):

δ=1.60 (s, 6H), 2.39 (s, 6H), 2.52 (s, 6H), 2.55 (s, 3H), 6.75-6.80 (m, 2H), 7.08 (d, J=8 Hz, 4H), 7.21 (d, J=8 Hz, 4H)

[Experimental Example 14]—Synthesis of Formula 14

[Formula 14]

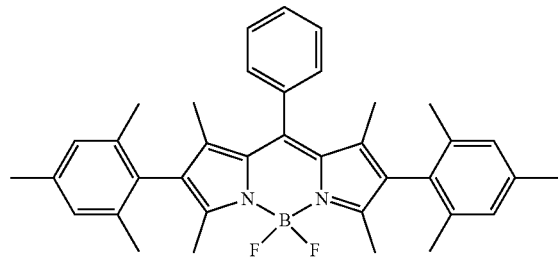

(IUPAC Name: 5,5-difluoro-2,8-dimesityl-1,3,7,9-tetramethyl-10-phenyl-5H-4λ⁴,5λ⁴-dipyrrolo[1,2-c:2',1'-f][1,3,2]diazaborinine)

A compound of Formula 14 was synthesized in the same manner as in Experimental Example 7, except that 4-methylphenylboronic acid was replaced with 2,4,6-trimethylphenylboronic acid. That is, the compound of Formula 14 was synthesized according to Scheme 14 below.

[Scheme 14]

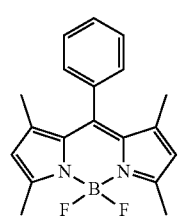 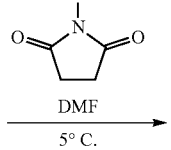 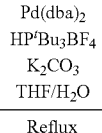

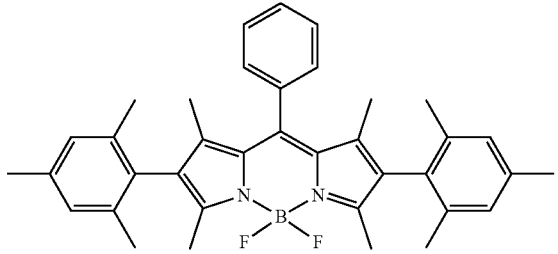

The preparation of the compound of Formula 14 was confirmed by ¹H-NMR analysis.

¹H-NMR (CDCl₃, ppm):

δ=1.09 (s, 6H), 1.96 (s, 12H), 2.29 (s, 6H), 2.31 (s, 6H), 7.38-7.42 (m, 2H), 7.44-7.49 (m, 3H)

[Experimental Example 15]—Synthesis of Formula 15

[Formula 15]

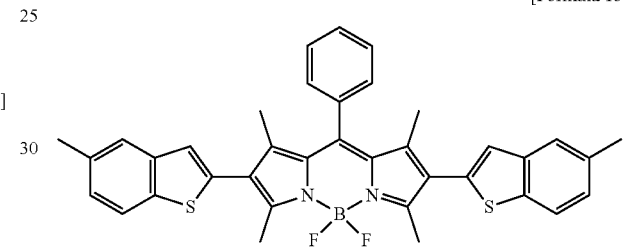

(IUPAC Name: 5,5-difluoro-1,3,7,9-tetramethyl-2,8-bis(5-methylbenzo[b]thiophen-2-yl)-10-phenyl-5H-4λ⁴,5λ⁴-dipyrrolo[1,2-c:2',1'-f][1,3,2]diazaborinine)

A compound of Formula 15 was synthesized in the same manner as in Experimental Example 7, except that 4-methylphenylboronic acid was replaced with 5-methylbenzo[b]thiophene-2-boronic acid. That is, the compound of Formula 15 was synthesized according to Scheme 15 below.

[Scheme 15]

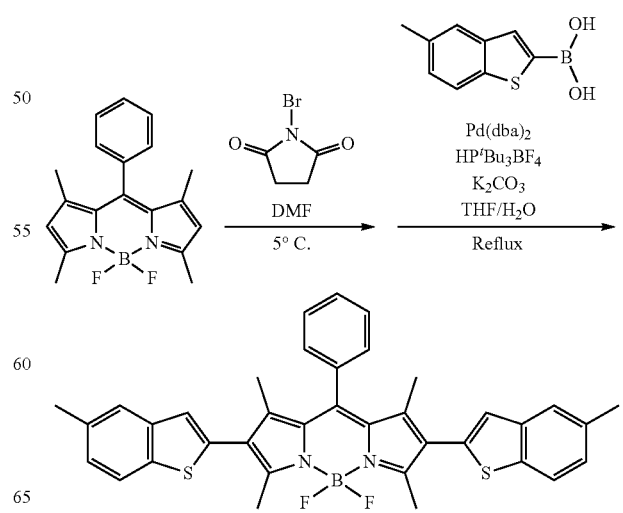

The preparation of the compound of Formula 15 was confirmed by ¹H-NMR analysis.

¹H-NMR (CDCl₃, ppm):

δ=1.26 (s, 6H), 2.45 (s, 6H), 2.47 (s, 6H), 7.18-7.22 (m, 5H), 7.24 (s, 1H), 7.36-7.54 (m, 5H), 7.77 (d, J=8.8 Hz, 2H)

[Experimental Example 16]—Synthesis of Formula 16

[Formula 16]

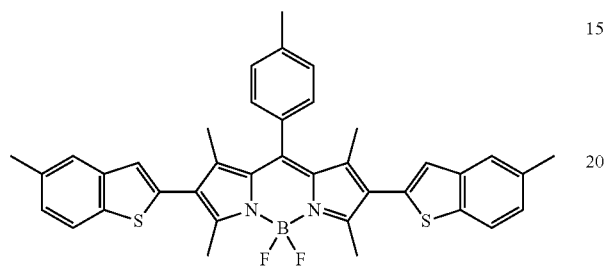

(IUPAC Name: 5,5-difluoro-1,3,7,9-tetramethyl-2,8-bis(5-methylbenzo[b]thiophen-2-yl)-10-(p-tolyl)-5H-4λ⁴,5λ⁴-dipyrrolo[1,2-c:2',1'-f][1,3,2]diazaborinine)

A compound of Formula 16 was synthesized in the same manner as in Experimental Example 10, except that 4-methylphenylboronic acid was replaced with 5-methylbenzo[b]thiophene-2-boronic acid. That is, the compound of Formula 16 was synthesized according to Scheme 16 below.

[Scheme 16]

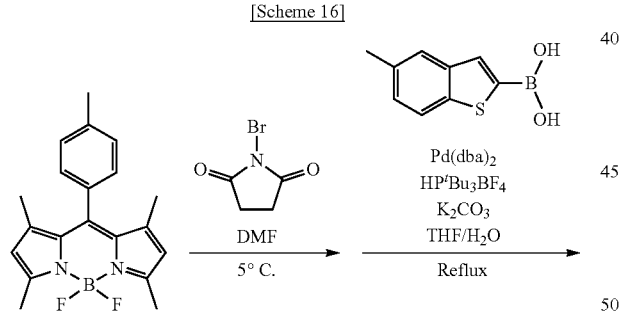

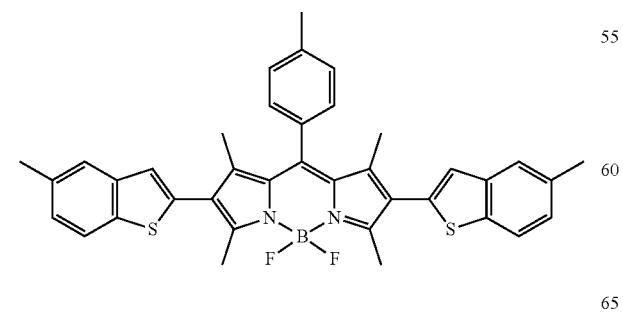

The preparation of the compound of Formula 16 was confirmed by ¹H-NMR analysis.

¹H-NMR (CDCl₃, ppm):

δ=1.28 (s, 6H), 2.41 (s, 3H), 2.45 (s, 6H), 2.47 (s, 6H), 7.18-7.23 (m, 5H), 7.23-7.33 (m, 5H), 7.77 (d, J=8.4 Hz, 2H)

Comparative Example 1

[Formula 17]

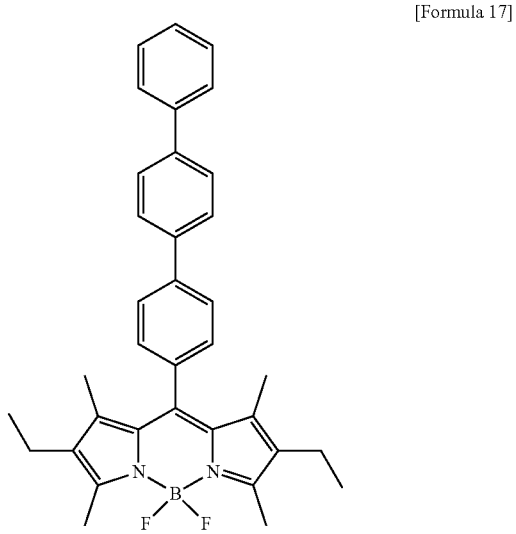

Comparative Example 2

[Formula 18]

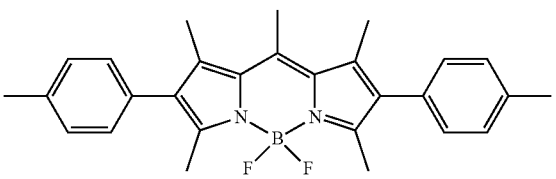

Comparative Example 3

[Formula 19]

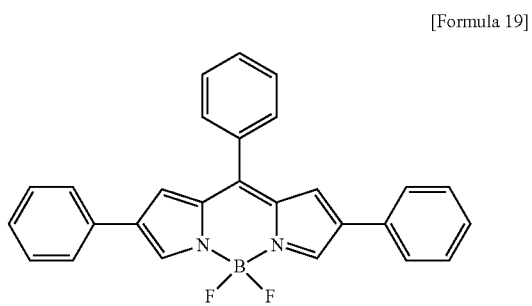

Comparative Example 4

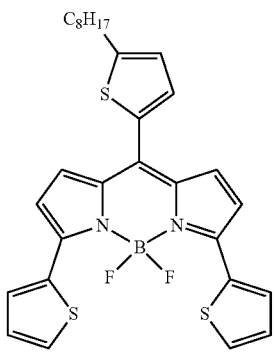

[Formula 20]

[Evaluation of Light Absorption Properties]

To evaluate the light absorption properties, in a thin-film state, of Experimental Examples 1 through 16 and Comparative Examples 1 through 4, the maximum absorption wavelengths (λ max), FWHMs, and extinction coefficients of Experimental Examples 1 through 16 and Comparative Examples 1 through 4 were measured and are shown in Table 1 below.

TABLE 1

|  | λ max [nm] | FWHM [nm] | Extinction Coefficient [×10⁴ cm⁻¹] |
|---|---|---|---|
| Experimental Example 1 | 556 | 101 | 11 |
| Experimental Example 2 | 553 | 93 | 12 |
| Experimental Example 3 | 530 | 92 | 12 |
| Experimental Example 4 | 550 | 69 | 12 |
| Experimental Example 5 | 551 | 69 | 13 |
| Experimental Example 6 | 547 | 63 | 15 |
| Experimental Example 7 | 559 | 80 | 11 |
| Experimental Example 8 | 555 | 87 | 8.8 |
| Experimental Example 9 | 550 | 91 | 7.0 |
| Experimental Example 10 | 552 | 88 | 8.0 |
| Experimental Example 11 | 553 | 69 | 16 |
| Experimental Example 12 | 549 | 68 | 14 |
| Experimental Example 13 | 578 | 94 | 8.6 |
| Experimental Example 14 | 534 | 53 | 17 |
| Experimental Example 15 | 539 | 73 | 13 |
| Experimental Example 16 | 538 | 71 | 14 |
| Comparative Example 1 | 539 | 45 | 11 |
| Comparative Example 2 | 526 | 100 | 9.2 |
| Comparative Example 3 | 600 or above | — | — |
| Comparative Example 4 | 328, 474, 654 | — | — |

As may be seen in Table 1, Experimental Examples 1 through 16 had a maximum absorption wavelength (λ max) of about 530 nm to about 560 nm and exhibited an absorption curve having a FWHM of about 50 nm to about 110 nm in a thin-film state. Experimental Examples 1 through 16 provide an excellent selective absorption property for light of a green wavelength range.

On the contrary, Comparative Example 3, which is the compound of Formula 19 having hydrogen atoms at positions corresponding to $R^1$, $R^2$, $R^3$, and $R^4$, had a maximum absorption wavelength (λ max) of about 600 nm. Comparative Example 3 exhibited an absorption property not only for light of a green wavelength range, but also for light of other wavelength ranges such as a red wavelength range.

Also, Comparative Example 4, which is the compound of Formula 20 having heteroaryl groups at positions corresponding to $R^1$ and $R^4$ and hydrogen atoms at positions corresponding to $R^2$ and $R^4$, had a maximum absorption wavelength (λ max) of about 530 nm to about 560 nm. Comparative Example 4 exhibited an absorption property not only for light of a green wavelength range, but also for light of other wavelength ranges such as blue- or red wavelength range.

[Evaluation of Thermal Stability]

To evaluate the thermal stability of Experimental Examples 1 through 16 and Comparative Examples 1 and 2, the transition temperatures (Tm), sublimation temperatures (Ts), and thermal degradation temperatures (Td) of Experimental Examples 1 through 16 and Comparative Examples 1 and 2 were measured and are shown in Table 2 below.

TABLE 2

|  | Tm [° C.] | Ts (−10%) [° C.] | Td (−10%) [° C.] |
|---|---|---|---|
| Experimental Example 1 | 235 | 228 | 370 |
| Experimental Example 2 | 367 | 247 | 375 |
| Experimental Example 3 | 230 | 241 | 379 |
| Experimental Example 4 | 290 | 235 | 381 |
| Experimental Example 5 | 288 | 229 | 371 |
| Experimental Example 6 | 311 | 229 | 351 |
| Experimental Example 7 | 300 or above | 234 | 374 |
| Experimental Example 8 | 300 or above | 220 | 365 |
| Experimental Example 9 | 300 or above | 219 | 364 |
| Experimental Example 10 | 300 or above | 229 | 371 |
| Experimental Example 11 | 300 or above | 226 | 369 |
| Experimental Example 12 | 300 or above | 234 | 380 |
| Experimental Example 13 | 300 or above | 214 | 361 |
| Experimental Example 14 | 260 or above | 180 | 338 |
| Experimental Example 15 | 328 | 236 | 376 |
| Experimental Example 16 | 296 | 234 | 374 |
| Comparative Example 1 | 285 | 211 | 358 |
| Comparative Example 2 | 293 | 183 | 339 |

As may be seen in Table 2, Experimental Examples 1 through 16 generally had a high transition temperature (Tm) and a sufficiently higher thermal degradation temperature (Td) than their sublimation temperature (Ts). Experimental Examples 1 through 16 exhibited an excellent thermal stability.

[Evaluation of Device Performance]

To evaluate the device performance of Experimental Examples 1 through 16 and Comparative Examples 1 and 2, Production Examples 1 through 18 were prepared as follows.

Production Example 1

A first electrode layer was formed of indium tin oxide (ITO) on a glass substrate. Thereafter, an electron-blocking layer having a thickness of 30 nm was formed of molybdenum oxide on the first electrode layer. Thereafter, an active layer having a thickness of 30 nm was formed on the electron-blocking layer by co-depositing the compound of Formula 1 and fullerene C60 (Frontier Carbon Company Ltd.) at a volume ratio of 3:2. Thereafter, a second electrode having a thickness of 100 nm was formed on the active layer by vacuum-depositing aluminum (Al). In this manner, an organic photoelectric device was fabricated.

Production Examples 2 Through 18

Organic photoelectric devices were fabricated in the same manner as in Production Example 1, except that the compound of Formula 1 was replaced with the compounds of Formulas 2 through 18. Thereafter, external quantum efficiencies (EQE), viz., the G-EQEs, blue-EQEs (B-EQEs), and red-EQEs (R-EQEs), of Production Examples 1 through 18 were measured and are shown in Table 3 below.

TABLE 3

|  | G-EQE [%] | B-EQE [%] | R-EQE [%] |
|---|---|---|---|
| Production Example 1 | 59 | 51 | 52 |
| Production Example 2 | 47 | 30 | 34 |
| Production Example 3 | 41 | 35 | 25 |
| Production Example 4 | 66 | 38 | 25 |
| Production Example 5 | 63 | 34 | 23 |
| Production Example 6 | 61 | 37 | 20 |
| Production Example 7 | 65 | 40 | 25 |
| Production Example 8 | 56 | 33 | 20 |
| Production Example 9 | 53 | 31 | 20 |
| Production Example 10 | 49 | 23 | 17 |
| Production Example 11 | 64 | 37 | 26 |
| Production Example 12 | 66 | 45 | 29 |
| Production Example 13 | 57 | 34 | 34 |
| Production Example 14 | 53 | 32 | 8 |
| Production Example 15 | 50 | 32 | 21 |
| Production Example 16 | 53 | 36 | 20 |
| Production Example 17 | 29 | 13 | 6 |
| Production Example 18 | 30 | 16 | 12 |

As may be seen in Table 3, the organic photoelectric devices according to Production Examples 1 through 16, which used the compounds of Formulae 1 through 16, respectively, exhibited an excellent EQE of about 40% or higher for light of a green wavelength range.

On the contrary, the organic photoelectric device according to Production Example 17, which used the compound of Formula 17 (having no aryl or heteroaryl group at a position corresponding to $A^1$ or $A^2$), had a relatively low EQE of about 29% for light of a green wavelength range, as compared to the organic photoelectric devices according to Production Examples 1 through 16.

Also, the organic photoelectric device according to Production Example 18, which used the compound of Formula 18 (having no aryl or heteroaryl group at a position corresponding to $A^3$), had a relatively low EQE of about 30% for light of a green wavelength range, as compared to the organic photoelectric devices according to Production Examples 1 through 16.

Production Examples 1 through 16 exhibited an excellent selective absorption property for light of a green wavelength range.

Organic photoelectric devices according to some embodiments of the present disclosure will hereinafter be described with reference to FIGS. 1 and 2.

FIG. 1 is a cross-sectional view of an organic photoelectric device according to some embodiments of the present disclosure. For convenience, descriptions of elements or features that have already been described above will be omitted or simplified.

Referring to FIG. 1, the organic photoelectric device may include a first electrode 110, an active layer 120, and a second electrode 130.

The first and second electrodes 110 and 130 may face each other. The active layer 120 may be between the first and second electrodes 110 and 130. The first and second electrodes 110 and 130 may be an anode and a cathode, respectively, or vice versa.

In an implementation, at least one of the first and second electrodes 110 and 130 may be a light-transmitting electrode. The light-transmitting electrode may include, e.g., ITO, zinc oxide (ZnO), tin dioxide ($SnO_2$), antimony-doped tin oxide (ATO), aluminum-doped zinc oxide (AZO), gallium-doped zinc oxide (GZO), titanium dioxide ($TiO_2$), fluorine-doped tin oxide (FTO), or a combination thereof.

In an implementation, at least one of the first and second electrodes 110 and 130 may include a single- or multilayer metallic film. In an implementation, one of the first and second electrodes 110 and 130 may be an opaque electrode. The opaque electrode may include, e.g., Al.

The active layer 120 may include a p- or n-type semiconductor material and may form a p-n junction. The active layer 120 may receive light from the outside, may generate excitons, and may split the excitons into holes and electrons.

The active layer 120 may include the organic compound represented by General Formula (1). In an implementation, the active layer 120 may include a p-type semiconductor material, e.g., one of the compounds of Formulas 1 through 16.

In an implementation, the active layer 120, which includes the organic compound represented by General Formula (1), may have a maximum absorption wavelength ($\lambda$ max) of about 530 to about 560 nm. In an implementation, the active layer 120, which includes the organic compound represented by General Formula (1), may exhibit an absorption curve with a FWHM of about 50 nm to about 110 nm. In an implementation, the active layer 120 may selectively absorb light of a green wavelength range.

The active layer 120 may be formed as a single layer or a multilayer. In an implementation, the active layer 120 may be formed as a single layer consisting of an intrinsic layer, a multilayer consisting of a p-type layer and an intrinsic layer, a multilayer consisting of a p-type layer, an intrinsic layer, and an n-type layer, or a multilayer consisting of a p-type layer and an n-type layer, but the present disclosure is not limited thereto. In an implementation, the active layer 120 may include an intrinsic layer including the organic compound represented by General Formula (1). In an implementation, the active layer 120 may include a p-type layer comprising the organic compound represented by General Formula (1).

In an implementation, the active layer 120 may further include an n-type semiconductor material. The n-type semiconductor material may include, e.g., fullerene, a fullerene derivative, or a combination thereof. In an implementation, the fullerene may be C60 fullerene. The fullerene derivative refers to a compound having a substituent on the fullerene. The fullerene derivative may include, e.g., an alkyl group, an aryl group, or a heterocyclic group.

In an implementation, the volume ratio of the organic compound represented by General Formula (1) to the fullerene in the active layer 120 may be about 7:3 to about 3:7.

In an implementation, the active layer 120 may include a bulk heterojunction (BHJ) of the organic compound represented by General Formula (1) and an n-type semiconductor material.

In an implementation, the active layer 120 may have a thickness of about 50 nm to about 200 nm.

In response to light of a particular wavelength range being absorbed by the active layer 120 through at least one of the first and second electrodes 110 and 130, excitons may be generated in the active layer 120. The excitons may be split into holes and electrons. The holes may move to one of the first and second electrodes 110 and 130 that is an anode, and the electrons may move to the other electrode, i.e., a cathode. As a result, a current may flow in the organic photoelectric device.

Figure 2:
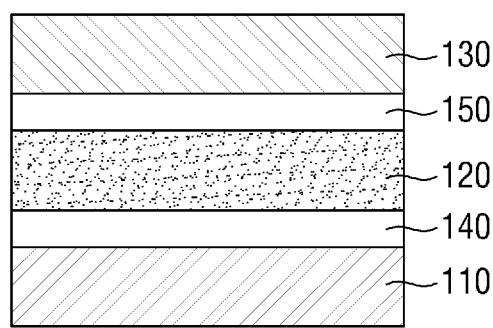
FIG. 2 is a cross-sectional view of an organic photoelectric device according to some embodiments of the present disclosure.

FIG. 2 is a cross-sectional view of an organic photoelectric device according to some embodiments of the present disclosure. For convenience, descriptions of elements or features that have already been described above will be omitted or simplified.

Referring to FIG. 2, the organic photoelectric device may further include first and second charge auxiliary layers 140 and 150.

The first charge auxiliary layer 140 may be between a first electrode 110 and an active layer 120. The second charge auxiliary layer 150 may be between a second electrode 130 and the active layer 120. The first and second charge auxiliary layers 140 and 150 may facilitate the movement of the holes and electrons split from the active layer 120 and may thus improve the photoelectric conversion efficiency of the organic photoelectric device.

The first and second charge auxiliary layers 140 and 150 may include a hole injection layer (HIL), which facilitates the injection of holes, a hole transport layer (HTL), which facilitates the movement of holes, an electron blocking layer (EML), which reduces or blocks the movement of electrons, an electron injection layer (EIL), which facilitates the injection of electrons, an electron transport layer (ETL), which facilitates the transport of electrons, a hole blocking layer (HBL), which reduces or blocks the movement of holes, and a combination thereof.

The first and second charge auxiliary layers 140 and 150 may include an organic material, an inorganic material, or a combination thereof. The organic material may be, e.g., an organic compound capable of injecting and/or transporting holes or electrons. The inorganic material may be, e.g., a metal oxide. In an implementation, the inorganic material may include, e.g., molybdenum oxide, tungsten oxide, nickel oxide, or a combination thereof.

The HTL and the EBL may include, e.g., poly(3,4-ethylenedioxythiophene):poly(styrenesulfonate) (PEDOT:PSS), poly(arylene amine), poly(N-vinylcarbazole), polyaniline, polypyrrole, N,N,N',N'-tetrakis(4-methoxyphenyl)-benzidine (TPD), 4,4'-bis[N-(1-naphthyl)-N-phenyl-amino] biphenyl (α-NPD), m-MTDATA, 4,4',4'-tris(N-carbazolyl)-triphenylamine (TCTA), or a combination thereof.

The ETL and the HBL may include, e.g., 1,4,5,8-naphthalene-tetracarboxylic dianhydride (NTCDA), bathocuproine (BCP), LiF, (tris(8-hydroxyquinolinato)aluminum (Alq$_3$), tris(8-hydroxyquinoline)gallium (Gaq$_3$), tris(8-hydroxyquinoline)indium (Inq$_3$), bis(8-hydroxyquinoline)zinc (Znq$_2$), bis(2-(2-hydroxyphenyl)benzothiazolate)zinc (Zn (BTZ)$_2$), bis(10-hydroxybenzo[h]quinolinato)beryllium (BeBq$_2$), or a combination thereof.

In an implementation, as illustrated in FIG. 2, both the first and second charge auxiliary layers 140 and 150 may be formed. In an implementation, the organic photoelectric device may not include one of the first and second charge auxiliary layers 140 and 150.

The organic photoelectric device may include the active layer 120, which includes the organic compound represented by General Formula (1), and the organic photoelectric device can have an improved photoelectric conversion efficiency and a stable external quantum efficiency (EQE).

The organic photoelectric devices of FIGS. 1 and 2 may be applied to image sensors, solar cells, photodetectors, photosensors, or organic light-emitting diodes (OLEDs).

Image sensors according to some embodiments of the present disclosure will hereinafter be described with reference to FIGS. 3 through 7.

Figure 3:
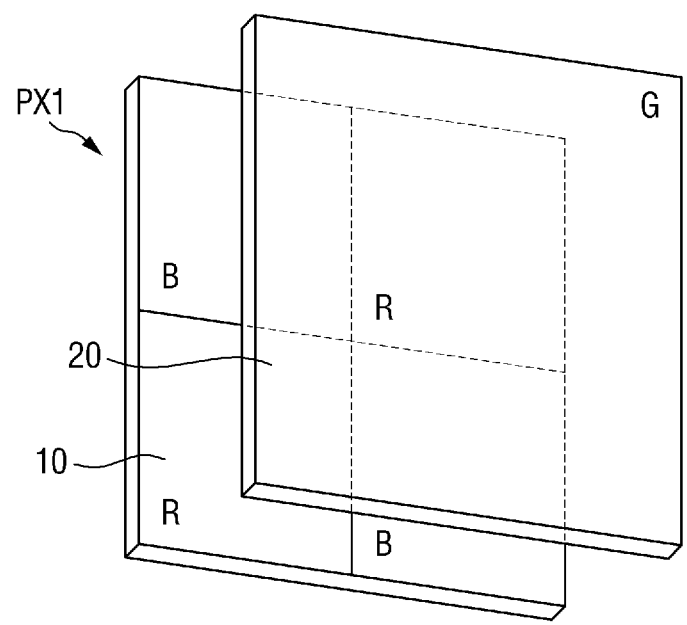
FIG. 3 is a perspective view of an image sensor according to some embodiments of the present disclosure.

FIG. 3 is a perspective view of an image sensor according to some embodiments of the present disclosure. For convenience, descriptions of elements or features that have already been described above may be omitted or simplified.

Referring to FIG. 3, the image sensor may include a first pixel PX1.

The first pixel PX1 may be formed in an optical stack structure including first and second layers 10 and 20, which are stacked. In an implementation, the first layer 10 may include two red (R) unit pixels and two blue (B) unit pixels, and the second layer 20 may include a green (G) unit pixel.

In an implementation, the second layer 20 may include the organic compound represented by General Formula (1). Accordingly, the image sensor may have an improved photoelectric conversion efficiency and a stable EQE.

Figure 4:
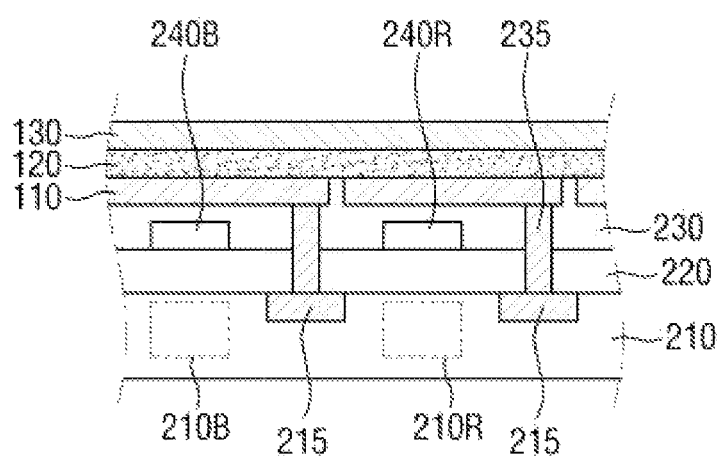
FIG. 4 is a cross-sectional view of an image sensor according to some embodiments of the present disclosure.

FIG. 4 is a cross-sectional view of an image sensor according to some embodiments of the present disclosure. For convenience, descriptions of elements or features that have already been described above may be omitted or simplified.

Referring to FIG. 4, the image sensor may include a substrate 210, a first photoelectric conversion layer 210B, a second photoelectric conversion layer 210R, a first interlayer insulating film 220, a second interlayer insulating film 230, a first color filter 240B, a second color filter 240R, a first electrode 110, an active layer 120, and a second electrode 130.

The substrate 210 may be a semiconductor substrate including a semiconductor material. In an implementation, the substrate 210 may be a bulk silicon substrate or a silicon-on-insulator (SOI) substrate. The substrate 210 may be a silicon substrate or may include another material, e.g., silicon germanium, indium antimonide, lead tellurium compound, indium arsenic, indium phosphide, gallium arsenide, or gallium antimonide. In an implementation, the substrate 210 may be a base substrate having an epitaxial layer formed thereon.

Various transistors for processing electrical signals may be formed on the substrate 210 and may be connected to the first and second photoelectric conversion layers 210B and 210R that will be described later. In an implementation, a transfer transistor, a reset transistor, a source follower transistor, or a selection transistor may be formed on the substrate 210.

In an implementation, a storage node 215 may be formed in the substrate 210. The storage node 215 may be electrically connected to the active layer 120 that will be described later. The storage node 215 may store charge generated from the active layer 120.

In an implementation, metal wires and pads may be formed on the substrate 210. In an implementation, the metal wires and the pads may be formed on the top or bottom surface of the substrate 210. The metal wires and the pads may include a metal having a relatively low specific resistance to prevent signal delays. In an implementation, the metal wires and the pads may include Al, copper (Cu), silver (Ag), or an alloy thereof.

The first and second photoelectric conversion layers 210B and 210R may be formed in the substrate 210. The first and second photoelectric conversion layers 210B and 210R may be formed by doping impurities into the substrate 210. In an implementation, the first and second photoelectric conversion layers 210B and 210R may be formed by implanting n-type impurities into a p-type substrate 210. The first and second photoelectric conversion layers 210B and 210R may generate electric charge in proportion to the amount of light provided from the outside.

Each of the first and second photoelectric conversion layers 210B and 210R may include, e.g., a photodiode, a phototransistor, a photogate, a pinned photodiode, an organic photodiode, a quantum dot, or a combination thereof.

In an implementation, the first and second photoelectric conversion layers 210B and 210R may detect light of different wavelength ranges. For example, the first photoelectric conversion layer 210B may detect light of a blue wavelength range, and the second photoelectric conversion layer 210R may detect light of a red wavelength range.

The first and second interlayer insulating films 220 and 230 may be sequentially stacked on the substrate 210. The first and second interlayer insulating films 220 and 230 may include, e.g., silicon oxide, silicon nitride, SiC, SiCOH, SiCO, SiOF, or a combination thereof.

The first and second color filters 240B and 240R may be formed on the first interlayer insulating film 220. In an implementation, the first and second color filters 240B and 240R may be formed in the second interlayer insulating film 230.

The first and second color filters 240B and 240R may be arranged to correspond to the first and second photoelectric conversion layers 210B and 210R, respectively. In an implementation, the first color filter 240B may be arranged to overlap with the first photoelectric conversion layer 210B, and the second color filter 240R may be arranged to overlap with the second photoelectric conversion layer 210R.

The first and second color filters 240B and 240R may have various colors depending on the first and second photoelectric conversion layers 210B and 210B. For example, the first and second color filters 240B and 240R may include red, green, or blue filters. In an implementation, the first and second color filters 240B and 240R may include yellow filters, magenta filters, or cyan filters and may further include white filters. In an implementation, the first color filter 240B may be a blue filter, and the second color filter 240R may be a red filter.

The first electrode 110, the active layer 120, and the second electrode 130 may be sequentially formed on the second interlayer insulating film 230. The first electrode 110, the active layer 120, and the second electrode 130 are similar to their respective counterparts of FIG. 1, and thus, detailed descriptions thereof may be omitted.

In an implementation, the first electrode 110 may be electrically connected to the storage node 215 via a through via 235. In an implementation, the through via 235 may penetrate the first and second interlayer insulating films 220 and 230 to electrically connect the first electrode 110 and the storage node 215. As a result, the charge generated in the active layer 120 by light may be transmitted to the storage node 215.

In some embodiments, a microlens may be formed on the second electrode 130. The microlens may have a convex shape and a predetermined curvature radius. Thus, the microlens may condense light incident thereupon. The microlens may include, e.g., a light-transmitting resin.

In an implementation, the image sensor may form the first pixel PX1 of FIG. 3. In an implementation, the first photoelectric conversion layer 210B may form the blue unit pixels of the first layer 10 by detecting light of a blue wavelength region that passes through the first color filter 240B, and the second photoelectric conversion layer 210R may form the red unit pixels of the first layer 10 by detecting light of a red wavelength region that passes through the second color filter 240R. As mentioned above, the active layer 120 may selectively absorb light of a green wavelength region. Accordingly, the active layer 120 may form the green unit pixel of the second layer 20.

In response to incident upon the second electrode 130 being provided, light of a green wavelength range may be absorbed by the active layer 10 to be subjected to photoelectric conversion, and light of other wavelength ranges may pass through the active layer 120 and the first electrode 110 and may be absorbed by the first and second photoelectric conversion layers 210B and 210R to be subjected to photoelectric conversion.

The image sensor may include the active layer 120, which includes the organic compound represented by General Formula (1), and the image sensor may have an improved photoelectric conversion efficiency and a stable EQE.

Also, the active layer 120 may have a stack structure, and the image sensor may be miniaturized. As a result, an image sensor with an improved integration density can be provided.

Figure 5:
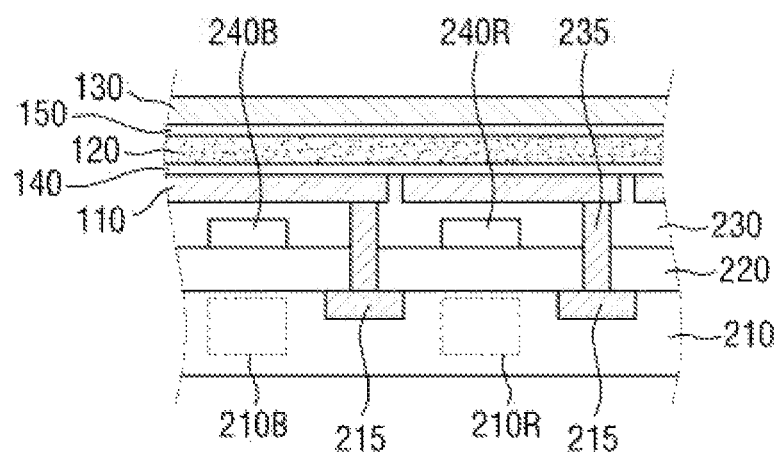
FIG. 5 is a cross-sectional view of an image sensor according to some embodiments of the present disclosure.

FIG. 5 is a cross-sectional view of an image sensor according to some embodiments of the present disclosure. For convenience, descriptions of elements or features that have already been described above may be omitted or simplified.

Referring to FIG. 5, the image sensor may further include first and second charge auxiliary layers 140 and 150.

The first and second charge auxiliary layers 140 and 150 may be similar to their respective counterparts of FIG. 2, and thus, detailed descriptions thereof may be omitted.

Figure 6:
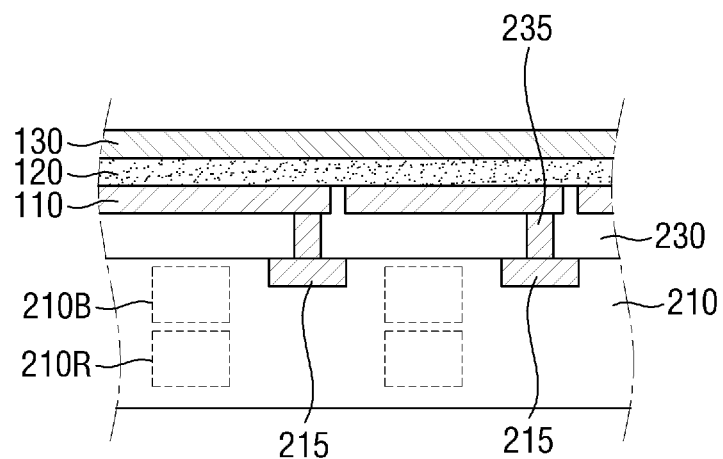
FIG. 6 is a cross-sectional view of an image sensor according to some embodiments of the present disclosure.

FIG. 6 is a cross-sectional view of an image sensor according to some embodiments of the present disclosure. For convenience, descriptions of elements or features that have already been described above may be omitted or simplified.

Referring to FIG. 6, the image sensor may include first and second photoelectric conversion layers 210B and 210R, which are arranged to overlap with each other.

Here, the expression "two elements overlap with each other" means that the two elements overlap with each other in a direction perpendicular to the surface of a substrate 210. For example, as illustrated in FIG. 6, the first photoelectric conversion layer 210B may be interposed between an active layer 120 and the second photoelectric conversion layer 210R.

The first and second photoelectric conversion layers 210B and 210R may selectively absorb light of a particular wavelength range depending on their depth. In an implementation, the first photoelectric conversion layer 210B may detect light of a blue wavelength range, and the second photoelectric conversion layer 210R may detect light of a red wavelength range.

Figure 7:
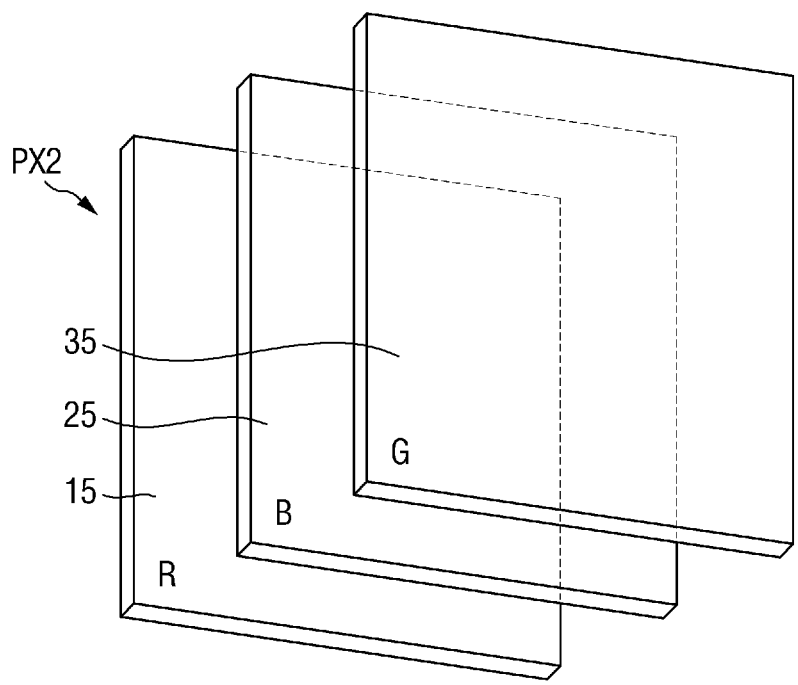
FIG. 7 is a perspective view of an image sensor according to some embodiments of the present disclosure.

FIG. 7 is a perspective view of an image sensor according to some embodiments of the present disclosure. For convenience, descriptions of elements or features that have already been described above may be omitted or simplified.

Referring to FIG. 7, the image sensor may include a second pixel PX2.

The second pixel PX2 may include third, fourth, and fifth layers 15, 25, and 35 and may be formed in an optical stack structure.

In an implementation, the third layer 15 may be a red unit pixel, the fourth layer 25 may be a blue unit pixel, and the fifth layer 35 may be a green (G) unit pixel. The third, fourth, and fifth layers 15, 25, and 35 are illustrated as being sequentially stacked. In an implementation, the order in which the third, fourth, and fifth layers 15, 25, and 35 are stacked may vary.

In an implementation, the fifth layer 35 may include the organic compound represented by General Formula (1). In an implementation, the image sensor may have an improved photoelectric conversion efficiency and a stable EQE.

In an implementation, the third layer 15 may include a pair of opposing electrodes and an organic compound between the pair of opposing electrodes and selectively absorbing light of a red wavelength range. In an implementation, the third layer 15 may include a pair of opposing electrodes and an organic compound between the pair of opposing electrodes and selectively absorbing light of a blue wavelength range.

Each of the image sensors of FIGS. 3 through 7 may be applicable to various electronic devices such as a mobile phone, a digital camera, a biosensor, or the like.

Electronic devices according to some embodiments of the present disclosure have been described with reference to FIGS. 3 through 7.

Figure 8:
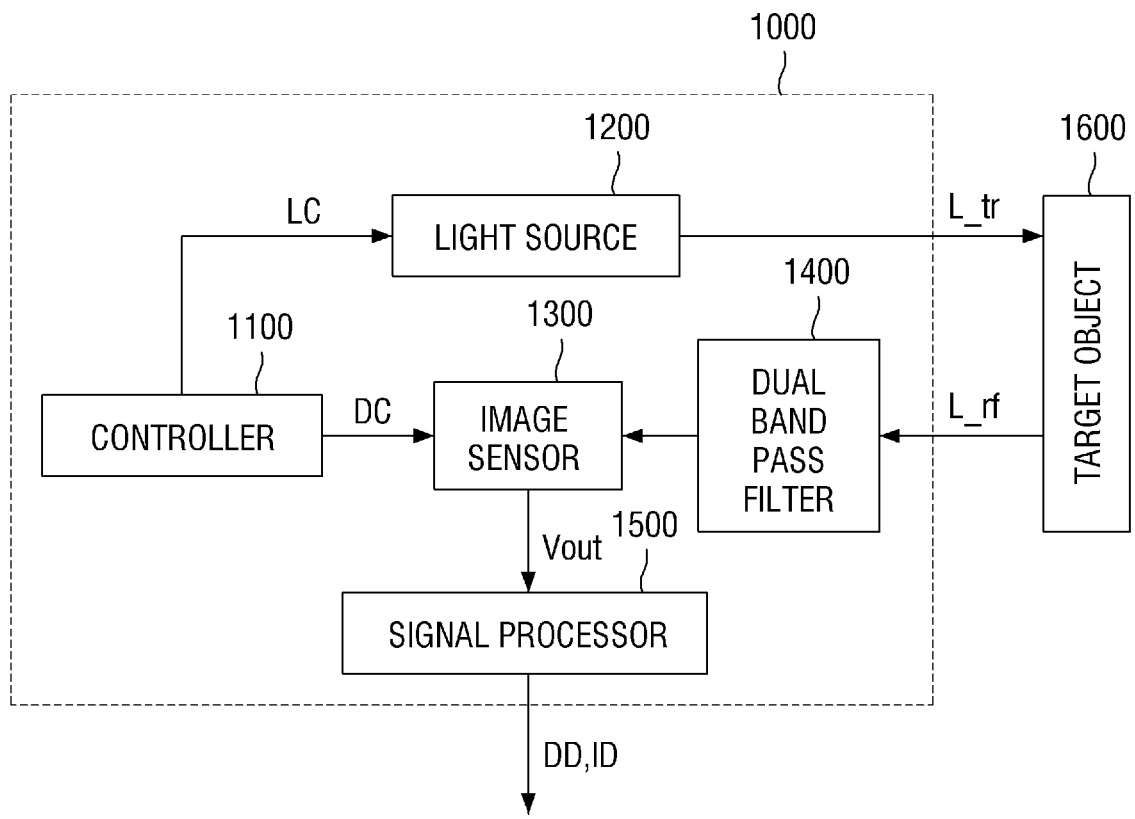
FIG. 8 is a diagram of an electronic device according to some embodiments of the present disclosure.

FIG. 8 is a diagram of an electronic device according to some embodiments of the present disclosure. For convenience, descriptions of elements or features that have already been described above may be omitted or simplified.

Referring to FIG. 8, an electronic device 1000 may form an image sensor module.

In an implementation, the electronic device 1000 may include a controller 1100, a light source 1200, an image sensor 1300, a dual band pass filter 1400, and a signal processor 1500.

The controller 1100 may control the operations of the light source 1200 and the image sensor 1300. In an implementation, the controller 1100 may control the operation of the light source 1200 by generating a light source control signa LC and may control the operation of the image sensor 1300 by generating a pixel array control signal DC for controlling a pixel array included in the image sensor 1300.

The light source 1200 may apply pulse light L_tr, e.g., light with its on/off timing controlled, to a target object 1600 in accordance with the light source control signal LC. The pulse light L_tr, which is periodically applied to the target object 1600, may be reflected by the target object 1600.

The image sensor 1300 may include a pixel array having a plurality of pixels. The image sensor 1300 may encompass the aforementioned image sensors and various modifications of the aforementioned image sensors without departing from the technical concept of the present disclosure.

The image sensor 1300 may receive light L_rf, reflected from the target object 1600, via the dual band pass filter 1400. The dual band pass filter 1400 may selectively pass therethrough light of a particular wavelength range among the light L_rf.

The image sensor 1300 may receive the light of the particular wavelength range, selectively passed through by the image sensor 1300, via the dual band pass filter 1400. Also, the image sensor 1300 may output a charge signal Vout in accordance with a pixel array control signal DC received from the controller 1100.

The signal processor 1500 may output predetermined information such as, for example, depth information DD or iris information ID, based on the charge signal Vout received from the image sensor 1300.

Figure 9:
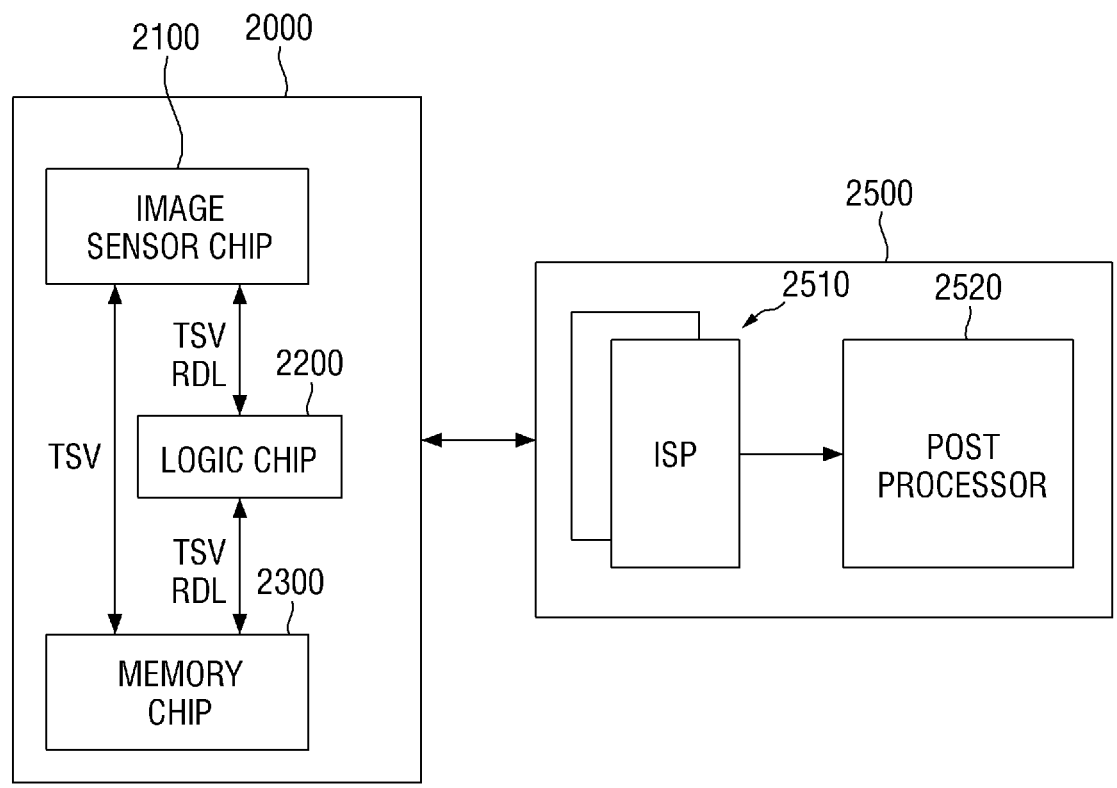
FIG. 9 is a diagram of an electronic device according to some embodiments of the present disclosure.

FIG. 9 is a block diagram of an electronic device according to some embodiments of the present disclosure. For convenience, descriptions of elements or features that have already been described above may be omitted or simplified.

Referring to FIG. 9, an electronic device 2000 may form an image sensor package including a complementary metal-oxide semiconductor (CMOS) image sensor.

In an implementation, the electronic device 2000 may include an image sensor chip 2100, a logic chip 2200, and a memory chip 2300. In an implementation, the image sensor chip 2100, the logic chip 2200, and the memory chip 2300 may be stacked and mounted on a package substrate. In an implementation, the logic chip 2200 may be mounted to be interposed between the memory chip 2300 and the image sensor chip 2100.

The image sensor chip 2100 may include a pixel array having a plurality of unit pixels and a wiring structure. The image sensor chip 2100 may encompass the aforementioned image sensors and various modifications of the aforementioned image sensors without departing from the technical concept of the present disclosure.

The logic chip 2200 may be configured to process a pixel signal output by the image sensor chip 2100.

The memory chip 2300 may be configured to store at least one of the pixel signal processed by the logic chip 2200 and the pixel signal output by the image sensor chip 2100. The memory chip 2300 may be connected to the logic chip 2200 via at least one redistribution structure RDL. The memory chip 2300 may be configured to be connected to the image sensor chip 2100 via the redistribution structure RDL and a contact TSV, which penetrates the logic chip 2200.

Image data may be transmitted from the pixel array of the image sensor chip 2100 to a plurality of analog-to-digital converters (ADCs) included in the logic chip 2200. Image data may be transmitted from the ADCs to the memory chip 2300 and may then be written to a memory cell array of the memory chip 2300.

Image signals processed by the logic chip 2200 may be transmitted to an image processing apparatus 2500. The image processing apparatus 2500 may include at least one image signal processor (ISP) 2510 and a postprocessor 2520.

The image processing apparatus 2500 may output images captured by the image sensor chip 2100 as previews via a display. In response to a capture command being received from, for example, a user, the images captured by the image sensor chip 2100 may be stored in the memory chip 2300.

The postprocessor 2520 may perform various operations for providing a digital image signal from the images captured by the image sensor chip 2100. In an implementation, the postprocessor 2520 may perform various postprocessing algorithms for improving contrast and sharpness or for removing noise, which are not performed by the image sensor chip 2100. The output of the postprocessor 2520 may be provided to a video codec processor. Image data processed by the video codec processor may be output to the display or may be stored in the memory chip 2300.

By way of summation and review, research has been conducted on organic materials that can replace materials for forming photodiodes, such as Si. Such organic materials may have a large extinction coefficient and may selectively absorb light of a particular wavelength range depending on their molecular structure, and they may replace a photodiode and a color filter at the same time and are highly suitable for increasing sensitivity and integration density.

One or more embodiments may provide an organic compound, an organic photoelectric device, an image sensor, and an electronic device that are capable of selectively absorbing light of a green wavelength range.

One or more embodiments may provide an organic compound capable of selectively absorbing light of a green wavelength range and having excellent thermal stability.

One or more embodiments may provide an organic photoelectric device having an improved photoelectric conversion efficiency and a stable external quantum efficiency (EQE).

One or more embodiments may provide an image sensor including an organic photoelectric device having an improved photoelectric conversion efficiency and a stable EQE.

One or more embodiments may provide an electronic device including an organic photoelectric device having an improved photoelectric conversion efficiency and a stable EQE.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic compound represented by General Formula (1):

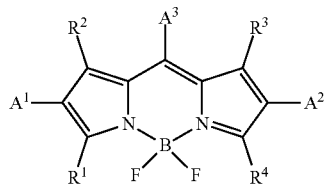

(1)

wherein, in General Formula (1), $R^1$, $R^2$, $R^3$, and $R^4$ are each independently a substituted or unsubstituted alkyl group having 1 to 4 carbon atoms, a substituted or unsubstituted alkoxy group having 1 to 4 carbon atoms, or a substituted or unsubstituted alkylthio group having 1 to 4 carbon atoms, $A^1$ and $A^2$ are each independently a 4-methylphenyl group, and $A^3$ is an aryl group including a ring that includes at least six members or a heteroaryl group including a ring that includes at least five members.

2. The organic compound as claimed in claim 1, wherein $R^1$, $R^2$, $R^3$, and $R^4$ are the same.

3. The organic compound as claimed in claim 2, wherein $R^1$, $R^2$, $R^3$, and $R^4$ are each a methyl group.

4. An organic compound represented by General Formula (1):

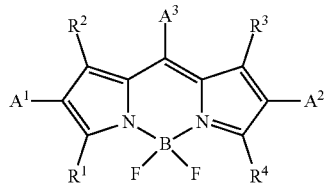

(1)

wherein, in General Formula (1), $R^1$, $R^2$, $R^3$, and $R^4$ are each independently a substituted or unsubstituted alkyl group having 1 to 4 carbon atoms, a substituted or unsubstituted alkoxy group having 1 to 4 carbon atoms, or a substituted or unsubstituted alkylthio group having 1 to 4 carbon atoms, $A^1$ and $A^2$ are each independently hydrogen, an aryl group including a ring that includes at least six members, or a heteroaryl group including a ring that includes at least five members, at least one of $A^1$ and $A^2$ being an aryl group including a ring that includes at least six members or a heteroaryl group including a ring that includes at least five members, $A^3$ is an aryl group including a ring that includes at least six members or a heteroaryl group including a ring that includes at least five members, wherein $A^3$ is a heteroaryl group including a 5-membered ring that includes a sulfur atom, and wherein at least one of $A^1$, $A^2$ or $A^3$ is a substituted aryl or heteroaryl group.

5. The organic compound as claimed in claim 4, wherein the 5-membered ring that includes a sulfur atom includes a thiophene ring.

6. The organic compound as claimed in claim 1, wherein $A^3$ is an aryl group including a 6-membered ring.

7. The organic compound as claimed in claim 1, wherein a number of rings included in the organic compound is 5 to 8.

8. The organic compound as claimed in claim 1, wherein $R^1$, $R^2$, $R^3$, and $R^4$ are each independently a substituted or unsubstituted alkyl group having 1 to 3 carbon atoms.

9. The organic compound as claimed in claim 6, wherein $A^3$ is an aryl group including a benzene ring.

10. An electronic device, comprising:

first and second electrodes facing each other; and an active layer between the first and second electrodes, wherein the active layer includes an organic compound represented by General Formula (1):

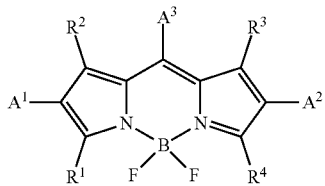

(1)

wherein, in General Formula (1), $R^1$, $R^2$, $R^3$, and $R^4$ are each independently a substituted or unsubstituted alkyl group having 1 to 4 carbon atoms, a substituted or unsubstituted alkoxy group having 1 to 4 carbon atoms, or a substituted or unsubstituted alkylthio group having 1 to 4 carbon atoms, $A^1$ and $A^2$ are each independently a 4-methylphenyl group, $A^3$ is an aryl group including a ring that includes at least six members, or a heteroaryl group including a ring that includes at least five members.

11. The electronic device as claimed in claim 10, wherein the active layer further includes an n-type semiconductor material.

12. The electronic device as claimed in claim 11, wherein the n-type semiconductor material includes fullerene, a fullerene derivative, or a combination thereof.

13. The electronic device as claimed in claim 11, wherein the active layer has a bulk heterojunction (BHJ) of the organic compound represented by General Formula (1) and the n-type semiconductor material.

14. The electronic device as claimed in claim 10, further comprising:
   a substrate including a semiconductor material;
   a photoelectric conversion layer in the substrate; and
   an interlayer insulating film on the substrate,
   wherein:
      the first electrode, the active layer, and the second electrode are sequentially stacked on the interlayer insulating film,
      the active layer detects light of a green wavelength range, and
      the photoelectric conversion layer detects light of a blue wavelength range or light of a red wavelength range.

15. An organic compound selected from the group consisting of

[Formula 4]

[Formula 5]

[Formula 7]

[Formula 8]

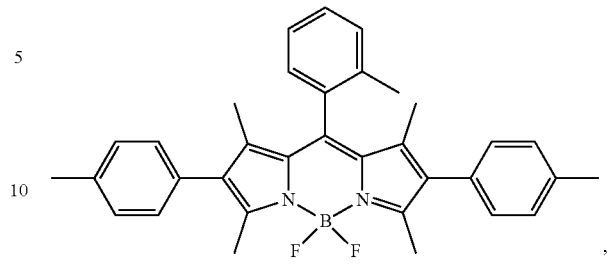

[Formula 9]

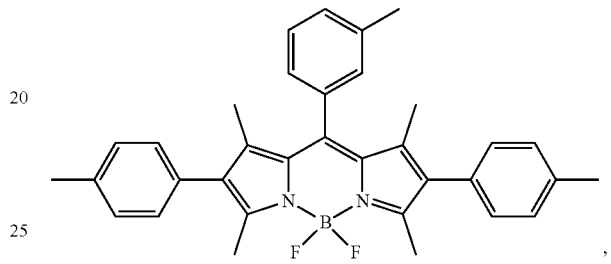

[Formula 10]

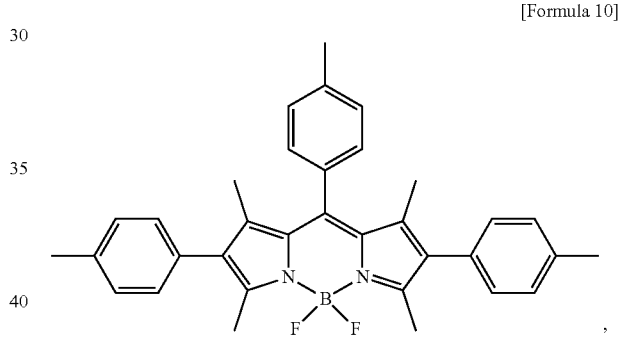

[Formula 11]

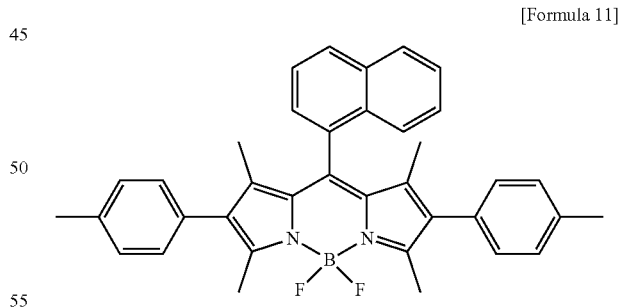

[Formula 12]

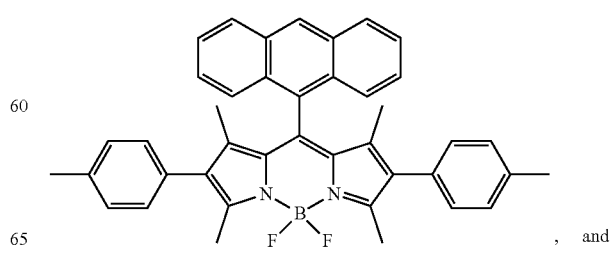

, and

[Formula 13]
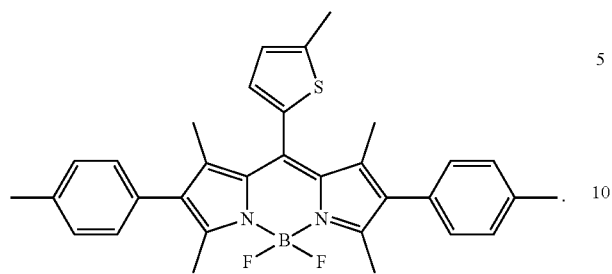
16. A photoelectric device including an active layer including the organic compound of claim 1.
17. A photoelectric device including an active layer including the organic compound of claim 4.
* * * * *